United States Patent
Fujikane et al.

(10) Patent No.: US 11,917,916 B2
(45) Date of Patent: *Feb. 27, 2024

(54) THERMOELECTRIC CONVERSION ELEMENT AND THERMOELECTRIC CONVERSION DEVICE

(71) Applicant: Panasonic Intellectual Property Management Co., Ltd., Osaka (JP)

(72) Inventors: Masaki Fujikane, Osaka (JP); Naoki Tambo, Kyoto (JP); Kunihiko Nakamura, Osaka (JP); Kouhei Takahashi, Osaka (JP); Yasuyuki Naito, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 211 days.

This patent is subject to a terminal disclaimer.

(21) Appl. No.: 17/349,738

(22) Filed: Jun. 16, 2021

(65) Prior Publication Data

US 2021/0313505 A1    Oct. 7, 2021

Related U.S. Application Data

(63) Continuation of application No. PCT/JP2019/043918, filed on Nov. 8, 2019.

(30) Foreign Application Priority Data

Feb. 28, 2019 (JP) ................................ 2019-035363
Oct. 25, 2019 (JP) ................................ 2019-194790

(51) Int. Cl.
*H10N 10/857* (2023.01)
*H10N 10/17* (2023.01)
*H10N 10/85* (2023.01)

(52) U.S. Cl.
CPC ........... *H10N 10/857* (2023.02); *H10N 10/17* (2023.02); *H10N 10/85* (2023.02)

(58) Field of Classification Search
CPC ....... H10N 10/17; H10N 10/85; H10N 10/857
See application file for complete search history.

(56) References Cited

U.S. PATENT DOCUMENTS

| 8,508,370 B1 | 8/2013 | El-Kady et al. |
| 2011/0095390 A1 | 4/2011 | Sakai et al. |

(Continued)

FOREIGN PATENT DOCUMENTS

| EP | 3422428 A1 | 1/2019 |
| JP | 2013-065801 A | 4/2013 |

(Continued)

OTHER PUBLICATIONS

The Extended European Search Report dated Apr. 19, 2022 for the related European Patent Application No. 19917215.6.

(Continued)

*Primary Examiner* — Lindsey A Buck
(74) *Attorney, Agent, or Firm* — Rimon P.C.

(57) ABSTRACT

A thermoelectric conversion element includes a p-type thermoelectric converter, an n-type thermoelectric converter, a first electrode, a second electrode, and a third electrode. One end of the p-type converter is electrically connected to one end of the n-type converter. The other end of the p-type converter is electrically connected to the second electrode, and the other end of the n-type converter is electrically connected to the third electrode. The p-type converter includes a first phononic crystal layer having a first phononic crystal structure including regularly arranged first through holes. The n-type converter includes a second phononic crystal layer having a second phononic crystal structure including regularly arranged second through holes. The (Continued)

through direction of the first through holes is a direction extending between the ends of the p-type converter. The through direction of the second through holes is a direction extending between the ends of the n-type converter.

14 Claims, 25 Drawing Sheets

(56) References Cited

U.S. PATENT DOCUMENTS

| | | | |
|---|---|---|---|
| 2011/0275165 A1 | 11/2011 | Suzuki et al. | |
| 2013/0019918 A1* | 1/2013 | Boukai | H01L 21/30604 438/54 |
| 2013/0255738 A1* | 10/2013 | Mitrovic | H10N 10/17 438/510 |
| 2017/0047499 A1 | 2/2017 | Hussein | |
| 2017/0069818 A1 | 3/2017 | Mitrovic et al. | |

FOREIGN PATENT DOCUMENTS

| | | |
|---|---|---|
| WO | 2010/113257 A1 | 10/2010 |
| WO | 2011/048634 | 4/2011 |

OTHER PUBLICATIONS

International Search Report of PCT application No. PCT/JP2019/043918 dated Jan. 21, 2020.

Jaeho Lee et al., "Ballistic Phonon Transport in Holey Silicon", Nano Letters 15, Apr. 10, 2015, pp. 3273-3279.

M. Nomura et al., "Impeded thermal transport in Si multiscale hierarchical architectures with phononic crystal nanostructures", Physical Review B 91, May 15, 2015, pp. 205422-1-205422-6.

* cited by examiner

THERMOELECTRIC CONVERSION ELEMENT AND THERMOELECTRIC CONVERSION DEVICE

BACKGROUND

1. Technical Field

The present disclosure relates to a thermoelectric conversion element including a member having a phononic crystal structure and to a thermoelectric conversion device including the thermoelectric conversion element.

2. Description of the Related Art

U.S. Patent Application Publication Nos. 2017/0047499 and 2017/0069818 and Nomura et al., "Impeded thermal transport in Si multiscale hierarchical architectures with phononic crystal nanostructures", Physical Review B 91, 205422 (2015) disclose periodic structures including a plurality of through holes. In these periodic structures, the through holes are regularly arranged in a thin film with a period of the order of nanometers (in the range of 1 nm to 1000 nm) in plan view. Each periodic structure is one type of phononic crystal structure. The phononic crystal structure of such a type generally has a unit cell that is a minimum unit forming the arrangement of the through holes. With this phononic crystal structure, the thermal conductivity of the thin film can be reduced. The thermal conductivity of a thin film can be reduced also by, for example, porosification. This is because the pores introduced into the thin film by the porosification reduce the thermal conductivity of the thin film. However, in the thin film having the phononic crystal structure, the thermal conductivity of the base material itself forming the thin film can be reduced. Therefore, it is expected to further reduce the thermal conductivity of such a thin film as compared with that achieved by simple porosification.

International Publication No. 2011/048634 discloses a thermoelectric conversion element including a p-type thermoelectric conversion material and an n-type thermoelectric conversion material.

SUMMARY

One non-limiting and exemplary embodiment provides a technique for increasing the thermoelectric conversion efficiency of a thermoelectric conversion element.

In one general aspect, the techniques disclosed here feature a thermoelectric conversion element including: a p-type thermoelectric converter; an n-type thermoelectric converter; a first electrode; a second electrode; and a third electrode, wherein a first end of the p-type thermoelectric converter is electrically connected to a first end of the n-type thermoelectric converter through the first electrode, wherein a second end of the p-type thermoelectric converter is electrically connected to the second electrode, wherein a second end of the n-type thermoelectric converter is electrically connected to the third electrode, wherein the p-type thermoelectric converter includes a first phononic crystal layer having a first phononic crystal structure including a plurality of regularly arranged first through holes, wherein the n-type thermoelectric converter includes a second phononic crystal layer having a second phononic crystal structure including a plurality of regularly arranged second through holes, wherein a through direction of the plurality of first through holes in the first phononic crystal structure is a direction extending between the first end of the p-type thermoelectric converter and the second end thereof, and wherein a through direction of the plurality of second through holes in the second phononic crystal structure is a direction extending between the first end of the n-type thermoelectric converter and the second end thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Figure 1:
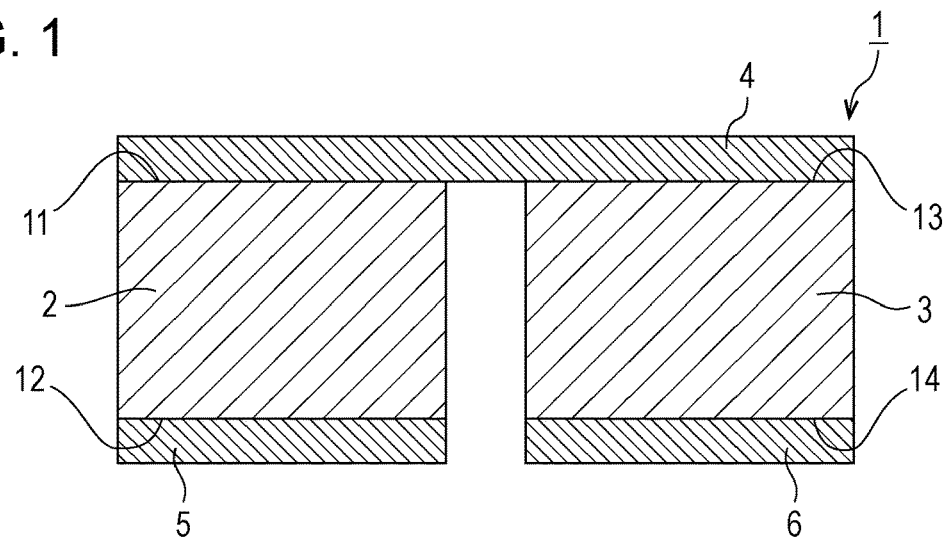
FIG. 1 is a cross-sectional view schematically showing an example of the thermoelectric conversion element of the present disclosure.

DETAILED DESCRIPTION (Findings Underlying the Present Disclosure)

In insulators and semiconductors, heat is transferred mainly by lattice vibrations called phonons. The thermal conductivity of a material composed of an insulator or a semiconductor is determined by the dispersion relation of phonons in the material. The dispersion relation of phonons means the relation between their frequency and wavenumber or the band structure of phonons. In insulators and semiconductors, phonons that transfer heat are present in a wide frequency band of from 100 GHz to 10 THz. This frequency band is a thermal band. The thermal conductivity of a material is determined by the dispersion relation of phonons in the thermal band.

In the above-described phononic crystal structures, the dispersion relation of phonons in the material can be controlled by the periodic structure formed from the through holes. Specifically, in a thin film having a phononic crystal structure, the thermal conductivity itself of the material of the thin film such as its base material can be controlled. In particular, the formation of a phononic band gap (PBG) by the phononic crystal structure can significantly reduce the thermal conductivity of the material. No phonons are allowed to exist in the PBG. Therefore, the PBG located in the thermal band can serve as a gap for thermal conduction. Moreover, in frequency bands other than the PBG, the gradients of the phonon dispersion curves are reduced by the PBG. The reduction in the gradients reduces the group velocity of phonons, causing a reduction in the speed of heat conduction. These characteristics significantly contribute to a reduction in the thermal conductivity itself of the material.

The thermoelectric conversion element of the present disclosure includes a pair of thermoelectric converters each including a phononic crystal layer having a phononic crystal structure including a plurality of regularly arranged through holes. In a first embodiment, the pair of thermoelectric converters are a p-type thermoelectric converter and an n-type thermoelectric converter. The p-type thermoelectric converter is electrically connected to a first electrode at a first end and electrically connected to a second electrode at a second end. The n-type thermoelectric converter is electrically connected to the first electrode at a first end and electrically connected to a third electrode at a second end. In a second embodiment, the pair of thermoelectric converters are two thermoelectric converters that have the same conductivity type and are adjacent to each other. A first one of the thermoelectric converters is electrically connected to a fourth electrode at a first end and electrically connected to a fifth electrode at a second end. A second one of the thermoelectric converters is electrically connected to the fourth electrode at a first end and electrically connected to a sixth electrode at a second end. Since the thermoelectric converters include respective phononic crystal layers, the thermal conductivity between the first end and the second end of each of the thermoelectric converters can be reduced. Therefore, in the thermoelectric conversion element of the present disclosure, the thermoelectric conversion efficiency can be improved.

EMBODIMENTS OF THE PRESENT DISCLOSURE

Embodiments of the present disclosure will be described with reference to the drawings. The embodiments described below show general or specific examples. Numerical values, shapes, materials, components, arrangements and connections of the components, process conditions, steps, the order of the steps, etc. shown in the following embodiments are merely examples and are not intended to limit the present disclosure. Among the components in the following embodiments, components not described in an independent claim representing the broadest concept will be described as optional components. The drawings are schematic drawings and are not necessarily strictly accurate illustrations.

First Embodiment

FIG. 1 shows an example of a thermoelectric conversion element in the first embodiment. The thermoelectric conversion element 1 in FIG. 1 includes a p-type thermoelectric converter 2, an n-type thermoelectric converter 3, a first electrode 4, a second electrode 5, and a third electrode 6. A first end 11 of the p-type thermoelectric converter 2 is electrically connected to a first end 13 of the n-type thermoelectric converter 3 through the first electrode 4. A second end 12 of the p-type thermoelectric converter 2 is electrically connected to the second electrode 5. A second end 14 of the n-type thermoelectric converter 3 is electrically connected to the third electrode 6. The thermoelectric conversion element 1 can function as a Peltier element that converts electric energy to thermal energy and can also function as a Seebeck element that converts thermal energy to electric energy.

Figure 2A:
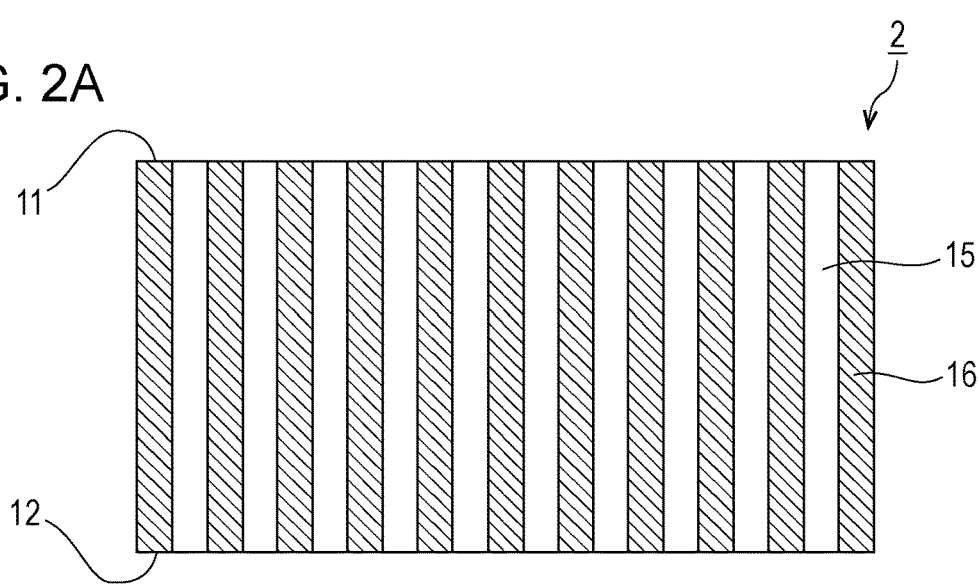
FIG. 2A is a cross-sectional view schematically showing an example of a p-type thermoelectric converter that the thermoelectric conversion element of the present disclosure can have.

An example of the p-type thermoelectric converter 2 is shown in FIG. 2A. The p-type thermoelectric converter 2 in FIG. 2A includes a first phononic crystal layer 16 having a first phononic crystal structure including a plurality of regularly arranged first through holes 15. The p-type thermoelectric converter 2 in FIG. 2A is a monolayer structure including the first phononic crystal layer 16. The through direction of the plurality of first through holes 15 in the first phononic crystal structure and the first phononic crystal layer 16 is a direction extending between the first end 11 of the p-type thermoelectric converter 2 and the second end 12 thereof. This direction is, for example, substantially perpendicular to surfaces of the p-type thermoelectric converter 2 that form the first end 11 and the second end 12, i.e., a surface connected to the first electrode 4 and/or a surface connected to the second electrode 5. The term "substantially perpendicular" as used herein means that, even when the relation between two directions deviates from a perpendicular relation by, 5 degrees or less, preferably 3 degrees or less, and more preferably 1 degree or less, these directions are regarded as perpendicular to each other.

Figure 2B:
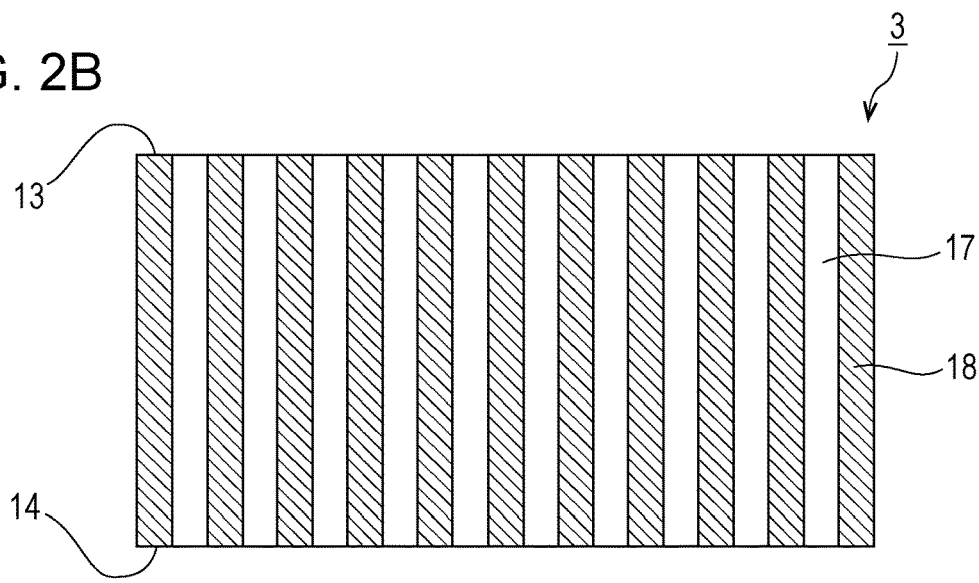
FIG. 2B is a cross-sectional view schematically showing an example of an n-type thermoelectric converter that the thermoelectric conversion element of the present disclosure can have.

An example of the n-type thermoelectric converter 3 is shown in FIG. 2B. The n-type thermoelectric converter 3 in FIG. 2B includes a second phononic crystal layer 18 having a second phononic crystal structure including a plurality of regularly arranged second through holes 17. The n-type thermoelectric converter 3 in FIG. 2B is a monolayer structure including the second phononic crystal layer 18. The through direction of the plurality of second through holes 17 in the second phononic crystal structure and the second phononic crystal layer 18 is a direction extending between the first end 13 of the n-type thermoelectric converter 3 and the second end 14 thereof. This direction is, for example, substantially perpendicular to surfaces of the n-type thermoelectric converter 3 that form the first end 13 and the second end 14, i.e., a surface connected to the first electrode 4 and/or a surface connected to the third electrode 6.

Figure 3A:
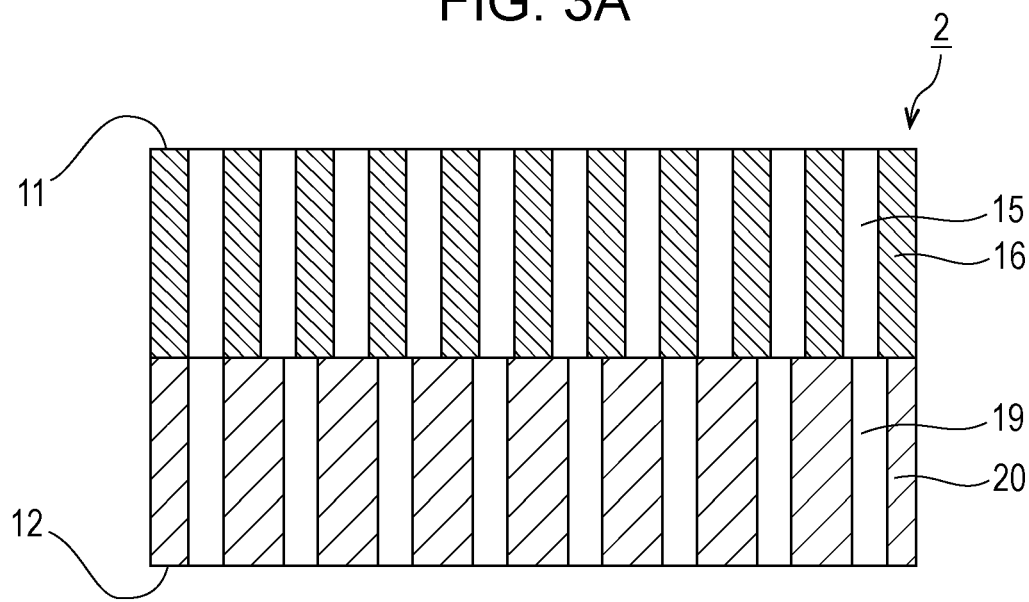
FIG. 3A is a cross-sectional view schematically showing another example of the p-type thermoelectric converter that the thermoelectric conversion element of the present disclosure can have.

Another example of the p-type thermoelectric converter 2 is shown in FIG. 3A. The p-type thermoelectric converter 2 in FIG. 3A further includes, in addition to the first phononic crystal layer 16, a third phononic crystal layer 20 having a third phononic crystal structure including a plurality of regularly arranged third through holes 19. The first phononic crystal layer 16 and the third phononic crystal layer 20 are stacked in the direction extending between the first end 11 of the p-type thermoelectric converter 2 and the second end 12 thereof. The through direction of the plurality of first through holes 15 in the first phononic crystal structure and the first phononic crystal layer 16 is substantially parallel to the through direction of the plurality of third through holes 19 in the third phononic crystal structure and the third phononic crystal layer 20. The p-type thermoelectric converter 2 in FIG. 3A is a stacked structure including the first phononic crystal layer 16 and the third phononic crystal layer 20. The first phononic crystal layer 16 and the third phononic crystal layer 20 are in contact with each other. The term "substantially parallel" as used herein means that, even when the relation between two directions deviates from a parallel relation by, for example, 5 degrees or less, preferably 3 degrees of less, and more preferably 1 degree or less, these directions are regarded as parallel to each other.

Figure 3B:
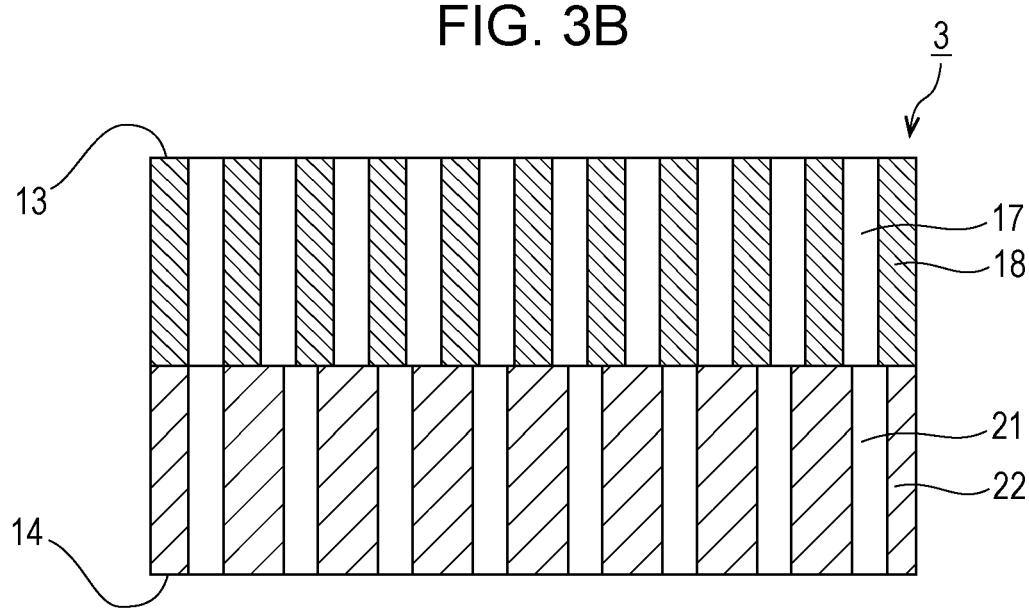
FIG. 3B is a cross-sectional view schematically showing another example of the n-type thermoelectric converter that the thermoelectric conversion element of the present disclosure can have.

Another example of the n-type thermoelectric converter 3 is shown in FIG. 3B. The n-type thermoelectric converter 3 in FIG. 3B further includes, in addition to the second phononic crystal layer 18, a fourth phononic crystal layer 22 having a fourth phononic crystal structure including a plurality of regularly arranged fourth through holes 21. The second phononic crystal layer 18 and the fourth phononic crystal layer 22 are stacked in the direction extending between the first end 13 of the n-type thermoelectric converter 3 and the second end 14 thereof. The through direction of the plurality of second through holes 17 in the second phononic crystal structure and the second phononic crystal layer 18 is substantially parallel to the through direction of the plurality of fourth through holes 21 in the fourth phononic crystal structure and the fourth phononic crystal layer 22. The n-type thermoelectric converter 3 in FIG. 3B is a stacked structure including the second phononic crystal layer 18 and the fourth phononic crystal layer 22. The second phononic crystal layer 18 is in contact with the fourth phononic crystal layer 22.

The PBG is distributed three-dimensionally, and it is expected that a heat flow in each phononic crystal layer can be controlled not only in its in-plane directions but also in its thickness direction and that the thermal conductivity can be reduced by controlling the heat flow. The phrase "the thickness direction of a phononic crystal layer" as used herein means the through direction of a plurality of regularly arranged through holes. In the p-type thermoelectric converter 2 and the n-type thermoelectric converter 3 shown in FIGS. 3A and 3B, respectively, at least two phononic crystal layers are stacked in the thickness direction. It is expected that the stack with an increased thickness will allow the heat flow in the p-type thermoelectric converter 2 and the n-type thermoelectric converter 3 in the thickness direction to be controlled more reliably.

The thicknesses of the first phononic crystal layer 16, the second phononic crystal layer 18, the third phononic crystal layer 20, and the fourth phononic crystal layer 22 are, for example, equal to or more than 10 nm and equal to or less than 500 nm. When the p-type thermoelectric converter 2 includes two or more phononic crystal layers, the thicknesses of these phononic crystal layers may be the same or different. When the n-type thermoelectric converter 3 includes two or more phononic crystal layers, the thicknesses of these phononic crystal layers may be the same or different.

No limitation is imposed on the number of phononic crystal layers included in the p-type thermoelectric converter 2. When the p-type thermoelectric converter 2 includes two or more phononic crystal layers, the phononic crystal layers may be stacked in contact with each other or may be stacked with another member interposed therebetween. No limitation is imposed on the number of phononic crystal layers included in the n-type thermoelectric converter 3. When the n-type thermoelectric converter 3 includes two or more phononic crystal layers, the phononic crystal layers may be stacked in contact with each other or may be stacked with another member interposed therebetween. The other member is, for example, an oxide film such as a $SiO_2$ film or a buffer layer described later.

Figure 4A:
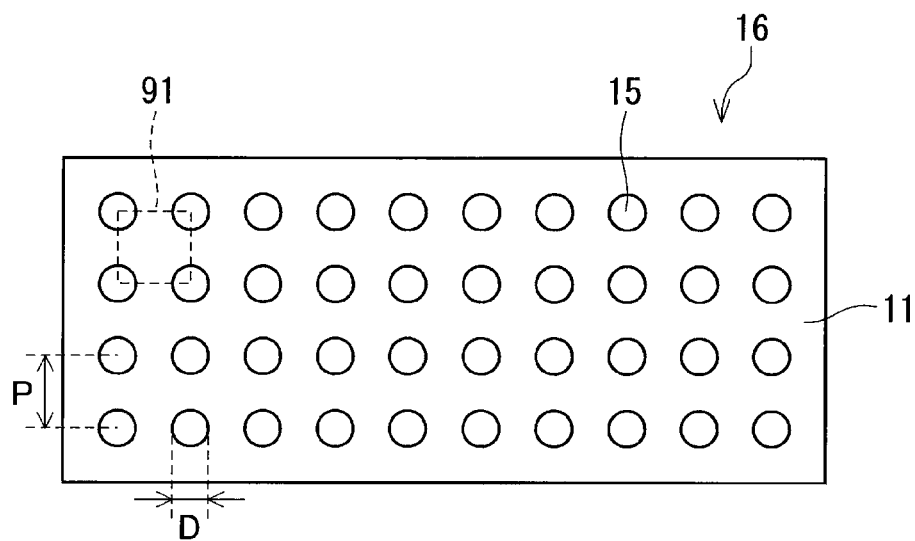
FIG. 4A is a plan view of the p-type thermoelectric converter in FIG. 3A when it is viewed from a first phononic crystal layer side.
Figure 4B:
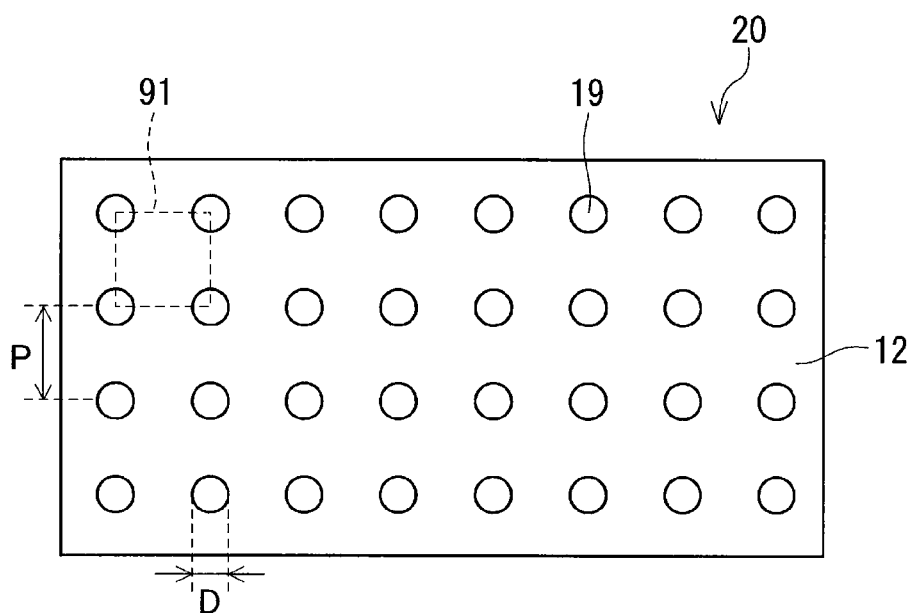
FIG. 4B is a plan view of the p-type thermoelectric converter in FIG. 3A when it is viewed from a third phononic crystal layer side.

FIG. 4A is a plan view showing the p-type thermoelectric converter 2 in FIG. 3A when it is viewed from the first phononic crystal layer 16 side. FIG. 4B is a plan view showing the p-type thermoelectric converter 2 in FIG. 3A when it is viewed from the third phononic crystal layer 20 side. In the p-type thermoelectric converter 2 in FIGS. 3A, 4A, and 4B, the first phononic crystal structure that the first phononic crystal layer 16 has structurally differs from the third phononic crystal structure that the third phononic crystal layer 20 has. Specifically, the period P of the arrangement of the first through holes 15 differs from the period P of the arrangement of the third through holes 19. When the first phononic crystal structure structurally differs from the third phononic crystal structure, at least part of the third through holes 19 are generally not in communication with the first through holes 15. In a p-type thermoelectric converter 2 including two or more phononic crystal layers, the phononic crystal layers may be structurally the same.

Figure 5A:
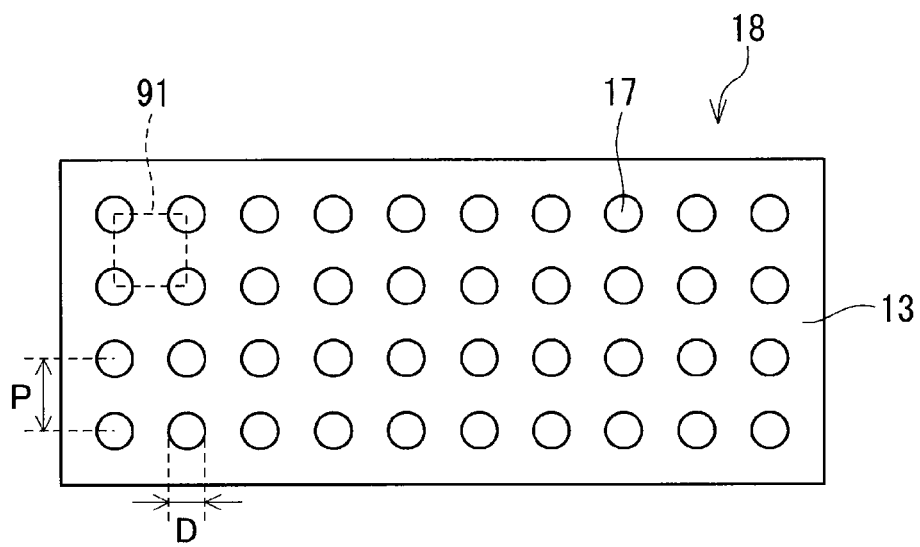
FIG. 5A is a plan view of the n-type thermoelectric converter in FIG. 3B when it is viewed from a second phononic crystal layer side.
Figure 5B:
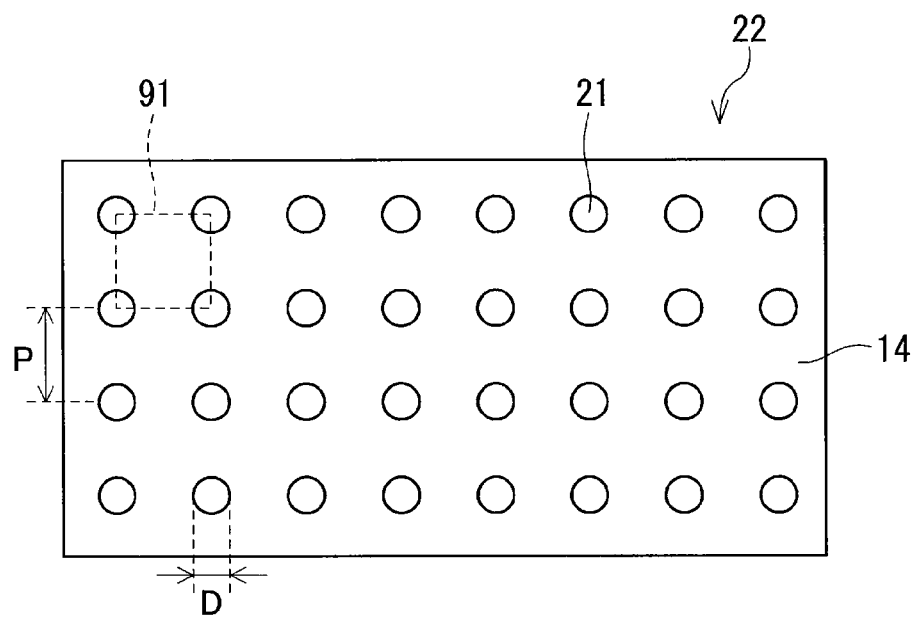
FIG. 5B is a plan view of the n-type thermoelectric converter in FIG. 3B when it is viewed from a fourth phononic crystal layer side.

FIG. 5A is a plan view showing the n-type thermoelectric converter 3 in FIG. 3B when it is viewed from the second phononic crystal layer 18 side. FIG. 5B is a plan view showing the n-type thermoelectric converter 3 in FIG. 3B when it is viewed from the fourth phononic crystal layer 22 side. In the n-type thermoelectric converter 3 shown in FIGS. 3B, 5A, and 5B, the second phononic crystal structure that the second phononic crystal layer 18 has structurally differs from the fourth phononic crystal structure that the fourth phononic crystal layer 22 has. Specifically, the period P of the arrangement of the second through holes 17 differs from the period P of the arrangement of the fourth through holes 21. When the second phononic crystal structure structurally differs from the fourth phononic crystal structure, at least part of the fourth through holes 21 are generally not in communication with the second through holes 17. In an n-type thermoelectric converter 3 including two or more phononic crystal layers, the phononic crystal layers may be structurally the same.

The phononic crystal layers that the p-type thermoelectric converter 2 has may be structurally the same as the phononic crystal layers that the n-type thermoelectric converter 3 has.

The thickness of the first phononic crystal layer 16 corresponding to the length of the first through holes 15 may be equal to or more than two times the diameter of the first through holes 15. The thickness of the second phononic crystal layer 18 corresponding to the length of the second through holes 17 may be equal to or more than two times the diameter of the second through holes 17. The thickness of the third phononic crystal layer 20 corresponding to the length of the third through holes 19 may be equal to or more than two times the diameter of the third through holes 19. The thickness of the fourth phononic crystal layer 22 corresponding to the length of the fourth through holes 21 may be equal to or more than two times the diameter of the fourth through holes 21. In these cases, the distance between the upper and lower surfaces of each of the phononic crystal layers 16, 18, 20, and 22 can be increased. Therefore, the difference in temperature between the upper and lower surfaces of each phononic crystal layer can be increased, so that the thermoelectric conversion efficiency can be improved. As used herein, the term "the upper and lower surfaces" of a phononic crystal layer means one principal surface of the phononic crystal layer and the other principal surface facing the one principal surface when the phononic crystal layer is viewed in the through direction of the through holes. The term "the principal surface" means a surface having the largest area. The upper limit of the thickness of each phononic crystal layer is, for example, equal to or less than 100 times the diameter of the through holes included in the crystal layer and may be equal to or less than 80 times, equal to or less than 60 times, and equal to or less than 50 times the diameter.

The ratio of the total volume of the through holes included in each phononic crystal layer to the volume of the phononic crystal layer, i.e., the porosity of the phononic crystal layer, may be equal to or more than 10%. In this case, the volume of the phononic crystal layer excluding the through holes can be reduced, so that the effect of the PBG can be increased. Therefore, the thermal conductivity of the phononic crystal layer can be further reduced, and the thermoelectric conversion efficiency can be increased. The upper limit of the porosity of the phononic crystal layer is, for example, equal to or lower than 90% and may be equal or lower than 70%, equal to or lower than 50%, and equal to or lower than 40%.

Examples of the case where the first phononic crystal structure structurally differs from the third phononic crystal structure include the following cases. A plurality of cases may be used in combination. The same applies to the case where the second phononic crystal structure structurally differs from the fourth phononic crystal structure. In this case, in the following description, "the first through holes 15" is replaced with "the second through holes 17", and "the third through holes 19" is replaced with "the fourth through holes 21."

The period P of the arrangement of the first through holes 15 differs from the period P of the arrangement of the third through holes 19.

The diameter D of the first through holes 15 differs from the diameter D of the third through holes 19.

The type of unit cell 91 including first through holes 15 differs from the type of unit cell 91 including third through holes 19.

As shown in a phononic crystal structure A described later, the arrangement of the first through holes 15 in the first phononic crystal structure and the arrangement of the third through holes 19 in the third phononic crystal structure are not always constant over the entire phononic crystal layers. In consideration of the above, when the first phononic crystal structure structurally differs from the third phononic crystal structure, the p-type thermoelectric converter 2 can have configurations described below. The p-type thermoelectric converter 2 may have a configuration obtained by combining any of the configurations described below. The same applies to the relation between the second and fourth phononic crystal structures that the n-type thermoelectric converter 3 can have. In this case, in the following description, "the first phononic crystal structure" is replaced with "the second phononic crystal structure," and "the third phononic crystal structure" is replaced with "the fourth phononic crystal structure." "The first through holes 15" is replaced with "the second through holes 17," and "the third through holes 19" is replaced with "the fourth through holes 21."

Configuration A: The first phononic crystal structure includes a domain A that is a phononic crystal region. The third phononic crystal structure includes a domain B that is a phononic crystal region. The domain A and the domain B overlap each other when viewed in the through direction of the first through holes and the third through holes 19. The period P of the arrangement of the first through holes 15 in the domain A differs from the period of the arrangement of the third through holes 19 in the domain B.

Configuration B: The first phononic crystal structure includes a domain A that is a phononic crystal region. The third phononic crystal structure includes a domain B that is a phononic crystal region. The domain A and the domain B overlap each other when viewed in the through direction of the first through holes and the third through holes 19. The diameter of the first through holes 15 in the domain A differs from the diameter of the third through holes 19 in the domain B.

Configuration C: The first phononic crystal structure includes a domain A that is a phononic crystal region. The third phononic crystal structure includes a domain B that is a phononic crystal region. The domain A and the domain B overlap each other when viewed in the through direction of the first through holes and the third through holes 19. The type of unit cell including first through holes 15 in the domain A differs from the type of unit cell including third through holes 19 in the domain B.

Each of the domains, which are phononic crystal regions, is a region having an area of, for example, equal to or more than $25\ P^2$ in plan view, where P is the period of the arrangement of the through holes 15, 17, 19, or 21. To control the dispersion relation of phonons using the phononic crystal structure, the domain may have an area of at least equal to or more than $25\ P^2$. When the length of the sides of a square domain in plan view is equal to or more than $5 \times P$, the area of the domain can be equal to or more than $25\ P^2$.

No limitation is imposed on the shape of each domain in plan view. The shape of each domain in plan view is, for example, a polygonal shape such as a triangular, square, or rectangular shape, a circular shape, an elliptical shape, or a combination thereof. Each domain may have an irregular shape in plan view. No limitation is imposed on the number of domains included in each phononic crystal structure. No limitation is imposed on the size of each domain included in the phononic crystal structure. One domain may be spread over the entire phononic crystal layer.

The term "in plan view" as used herein means that an object is viewed in the through direction of the through holes included in the phononic crystal structure. When the object has a thin film shape, the through direction of the through holes is typically a direction substantially perpendicular to a principal surface of the object.

The period P of the arrangement of the through holes 15, 17, 19, or 21 is, for example, equal to or more than 1 nm and equal to or less than 300 nm. This is because the wavelength of phonons carrying heat ranges mainly from 1 nm to 300 nm. The period P is determined by the center-to-center distance between adjacent through holes 15, 17, 19, or 21 in plan view.

The diameter D of the through holes 15, 17, 19, or 21 satisfies, for example, D/P 0.5, where D/P is the ratio of the diameter D to the period P. If the ratio D/P<0.5, the porosity of the phononic crystal structure is excessively small, so that the heat flow may not be controlled sufficiently, e.g., the thermal conductivity may not be sufficiently reduced. The upper limit of the ratio D/P is, for example, less than 0.9 in order to prevent contact between adjacent through holes 17, 19, or 21. The diameter D of the through holes 15, 17, 19, or 21 is the diameter of their openings. When the openings of the through holes 15, 17, 19, or 21 have a circular shape in plan view, the diameter D is the diameter of the circular shape. The openings of the through holes 15, 17, 19, or 21 may have a non-circular shape in plan view. In this case, the diameter D is defined as the diameter of a virtual circle having the same area as the area of the openings.

Figure 6A:
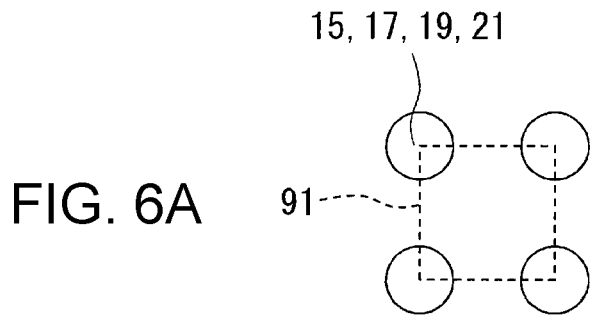
FIG. 6A is a schematic illustration showing an example of a unit cell of a phononic crystal structure that the thermoelectric conversion element of the present disclosure can have.
Figure 6B:
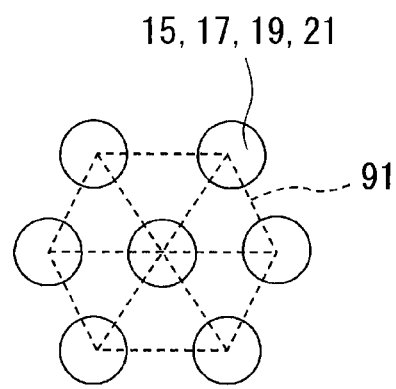
FIG. 6B is a schematic illustration showing another example of the unit cell of the phononic crystal structure that the thermoelectric conversion element of the present disclosure can have.
Figure 6C:
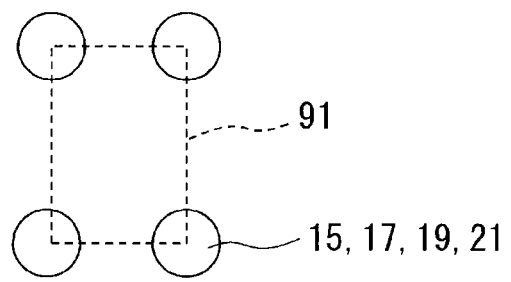
FIG. 6C is a schematic illustration showing yet another example of the unit cell of the phononic crystal structure that the thermoelectric conversion element of the present disclosure can have.
Figure 6D:
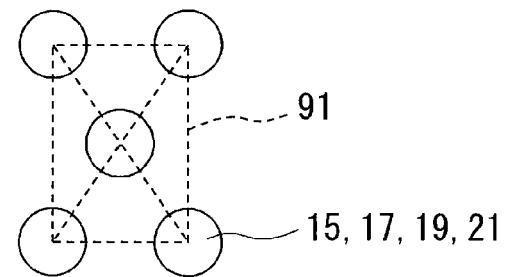
FIG. 6D is a schematic illustration showing still another example of the unit cell of the phononic crystal structure that the thermoelectric conversion element of the present disclosure can have.

Examples of the type of unit cell 91 including a plurality of regularly arranged through holes 15, 17, 19, or 21 include a square lattice (FIG. 6A), a hexagonal lattice (FIG. 6B), a rectangular lattice (FIG. 6C), and a centered rectangular lattice (FIG. 6D). However, the type of unit cell 91 is not limited to these examples.

The material M forming the p-type thermoelectric converter 2, the n-type thermoelectric converter 3, and the phononic crystal layers that the p-type thermoelectric converter 2 and the n-type thermoelectric converter 3 can have is typically a semiconductor material doped with an impurity element such that the material is of an appropriate semiconductor type (conductivity type) such as the p or n type. The semiconductor material is, for example, silicon (Si), Ge, SiGe, SiC, ZnSe, CdSn, ZnO, GaAs, InP, or GaN. The material M may be a material other than the semiconductor materials, and such a material is, for example, TiN, SiN, or $VO_2$. However, the material M is not limited to the above examples.

Among semiconductor materials, a Si-based semiconductor material generally has a relatively high thermal conductivity. Therefore, in a conventional thermoelectric conversion element including thermoelectric converters formed of a Si-based semiconductor material, it is difficult to obtain high thermoelectric conversion efficiency. However, in the thermoelectric conversion element of the present disclosure, the thermoelectric converters each have a phononic crystal layer. Therefore, in the thermoelectric conversion element of the present disclosure, high thermoelectric conversion efficiency can be obtained even when the thermoelectric converters are formed of a Si-based semiconductor material.

The following advantages, for example, are obtained when the thermoelectric converters can be formed of a Si-based semiconductor material.

The thermoelectric conversion element and a thermoelectric conversion device including this element can be formed on a base substrate formed of a Si-based semiconductor material such as a Si wafer.

The thermoelectric conversion element and/or the thermoelectric conversion device can be embedded in a base substrate formed of a Si-based semiconductor material. In this case, for example, an electronic device such as a CPU can be formed on the base substrate in which the thermoelectric conversion element and/or the thermoelectric conversion device is embedded. This means, for example, that an electronic device in which a Peltier element for cooling and/or a Peltier-type cooling device is embedded can be produced.

The first phononic crystal structure and the second phononic crystal structure may have the following configuration. The first phononic crystal structure includes a first domain and a second domain that are phononic crystal regions. The first domain includes a plurality of first through holes 15 regularly arranged in a first direction in a cross section perpendicular to the through direction of the first through holes 15. The second domain includes a plurality of first through holes 15 regularly arranged in a second direction different from the first direction in the cross section perpendicular to the through direction of the first through holes 15. The second phononic crystal structure includes a third domain and a fourth domain that are phononic crystal regions. The third domain includes a plurality of second through holes 17 regularly arranged in a third direction in a cross section perpendicular to the through direction of the second through holes 17. The fourth domain includes a plurality of second through holes 17 regularly arranged in a fourth direction different from the third direction in the cross section perpendicular to the through direction of the second through holes 17.

The first phononic crystal structure, the second phononic crystal structure, the third phononic crystal structure, and the fourth phononic crystal structure may have the following configuration. The first phononic crystal structure includes a first domain and a second domain that are phononic crystal regions. The first domain includes a plurality of first through holes 15 regularly arranged in a first direction in a cross section perpendicular to the through direction of the first through holes 15. The second domain includes a plurality of first through holes 15 regularly arranged in a second direction different from the first direction in the cross section perpendicular to the through direction of the first through holes 15. The second phononic crystal structure includes a third domain and a fourth domain that are phononic crystal regions. The third domain includes a plurality of second through holes 17 regularly arranged in a third direction in a cross section perpendicular to the through direction of the second through holes 17. The fourth domain includes a plurality of second through holes 17 regularly arranged in a fourth direction different from the third direction in the cross section perpendicular to the through direction of the second through holes 17. The third phononic crystal structure includes a fifth domain and a sixth domain that are phononic crystal regions. The fifth domain includes a plurality of third through holes 19 regularly arranged in a fifth direction in a cross section perpendicular to the through direction of the third through holes 19. The sixth domain includes a plurality of third through holes 19 regularly arranged in a sixth direction different from the fifth direction in the cross section perpendicular to the through direction of the third through holes 19. The fourth phononic crystal structure includes a seventh domain and an eighth domain that are phononic crystal regions. The seventh domain includes a plurality of fourth through holes 21 regularly arranged in a seventh direction in a cross section perpendicular to the through direction of the fourth through holes 21. The eighth domain includes a plurality of fourth through holes 21 regularly arranged in an eighth direction different from the seventh direction in the cross section perpendicular to the through direction of the fourth through holes 21.

Each of the phononic crystal structures including a plurality of domains distinguished by their arrangement orientation is hereinafter referred to as a phononic crystal structure A. The arrangement orientation can be determined by the orientation of the unit cell.

According to studies by the present inventors, the degree of reduction in thermal conductivity obtained by a phononic crystal structure depends on the angle between the direction of heat transfer and the orientation of the unit cell of the phononic crystal structure. This may be because factors relating to heat conduction such as the number of PBGs, the band width of each PBG, the average group velocity of phonons depend on the above angle. As for heat transfer, phonons flow in a direction from a high temperature side to a low temperature side in a macroscopic sense. When attention is focused on micro-regions of the order of nanometers, the flow of phonons has no directivity. Specifically, phonons do not flow in a uniform direction in a microscopic sense.

The above-described U.S. Patent Application Publication Nos. 2017/0047499 and 2017/0069818 and Nomura et al., "Impeded thermal transport in Si multiscale hierarchical architectures with phononic crystal nanostructures", Physical Review B 91, 205422 (2015) disclose members each having a plurality of phononic crystal regions with the same unit cell orientation. In these members, their interaction with phonons flowing in a specific direction is maximized in a microscopic sense, but the interaction with phonons flowing in the other directions is weakened. The phononic crystal structure A includes two or more phononic crystal regions with different unit cell directions. Therefore, the interaction with phonons flowing in a plurality of directions can be enhanced in a microscopic sense. This feature allows the flexibility in controlling the heat flow to be further improved.

The following description relates to the phononic crystal structure A that at least one phononic crystal layer selected from the first phononic crystal layer 16, the second phononic crystal layer 18, the third phononic crystal layer 20, and the fourth phononic crystal layer 22 can have. When a plurality of phononic crystal layers have their respective phononic crystal structures A, these phononic crystal structures A may be structurally the same or different.

Figure 7:
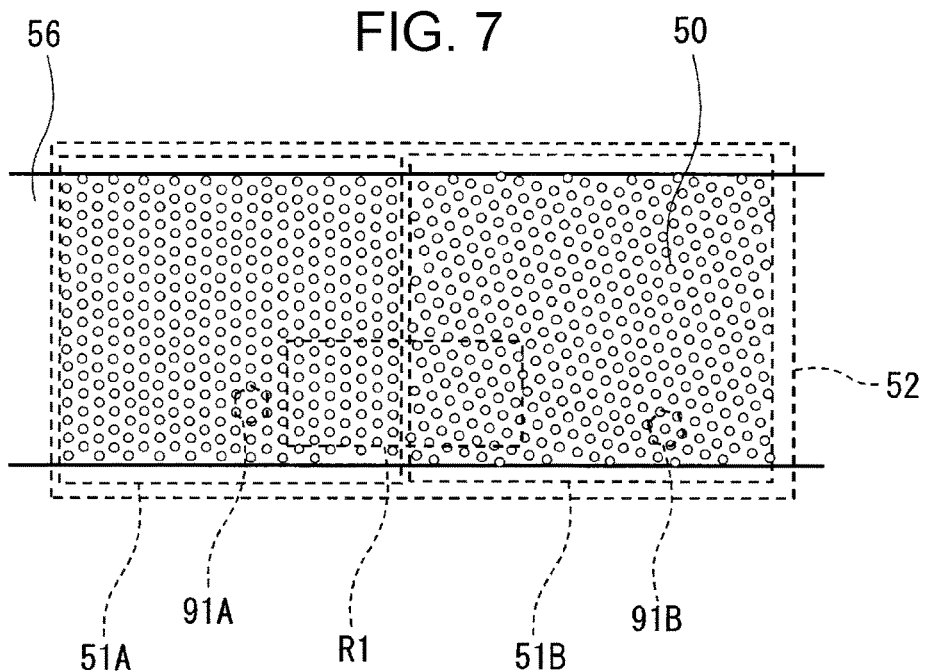
FIG. 7 is a plan view schematically showing an example of the phononic crystal structure that the thermoelectric conversion element of the present disclosure can have.

An example of the phononic crystal structure A is shown in FIG. 7. FIG. 7 shows a plan view of part of a phononic crystal layer 56. The phononic crystal layer 56 may be at least one phononic crystal layer selected from the first phononic crystal layer 16, the second phononic crystal layer 18, the third phononic crystal layer 20, and the fourth phononic crystal layer 22. The phononic crystal layer 56 is a thin film having a thickness of, for example, equal to or larger than 10 nm and equal to or less than 500 nm. The phononic crystal layer 56 is rectangular in plan view. A plurality of through holes 50 extending in the thickness direction of the phononic crystal layer 56 are provided in the phononic crystal layer 56. The phononic crystal structure A that the phononic crystal layer 56 has is a two-dimensional phononic crystal structure in which the plurality of through holes 50 are regularly arranged in in-plane directions. In the following description of the phononic crystal structure A, when the crystal layer having the phononic crystal structure A is the second phononic crystal layer 18, "the first domain" is replaced with "the third domain," and "the second domain" is replaced with "the fourth domain." When the crystal layer having the phononic crystal structure A is the third phononic crystal layer 20, "the first domain" is replaced with "the fifth domain," and "the second domain" is replaced with "the sixth domain." When the crystal layer having the phononic crystal structure A is the fourth phononic crystal layer 22, "the first domain" is replaced with "the seventh domain," and "the second domain" is replaced with "the eighth domain."

The phononic crystal structure A includes the first domain 51A and the second domain 51B that are phononic crystal regions. The first domain 51A has a phononic single crystal structure including a plurality of through holes 50 arranged regularly in a first direction in plan view. The second domain 51B has a phononic single crystal structure including a plurality of through holes 50 arranged regularly in a second direction different from the first direction in plan view. In each of the single crystal structures, the plurality of through holes 50 have the same diameter and arranged with the same period. In each of the single crystal structures, the orientations of unit cells 91A or 91B of the plurality of regularly arranged through holes 50 are the same. The first domain 51A and the second domain 51B each have a rectangular shape in plan view. The shape of the first domain 51A and the shape of the second domain 51B are the same in plan view. The phononic crystal structure A is also a phononic polycrystal structure 52 that is a complex body including a plurality of phononic single crystal structures.

Figure 8A:
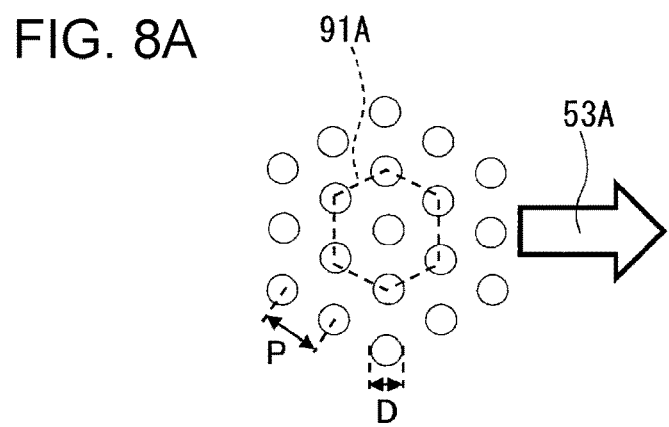
FIG. 8A is a schematic illustration showing a unit cell of a first domain included in the phononic crystal structure in FIG. 7 and the orientation of the unit cell.
Figure 8B:
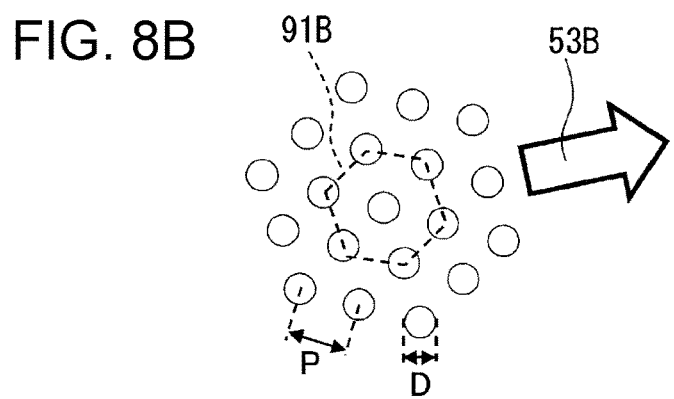
FIG. 8B is a schematic illustration showing a unit cell of a second domain included in the phononic crystal structure in FIG. 7 and the orientation of the unit cell.

As shown in FIGS. 8A and 8B, in the phononic crystal structure A, the orientation 53A of each unit cell 91A in the first domain 51A differs from the orientation 53B of each unit cell 91B in the second domain 51B in plan view. The angle between the orientation 53A and the orientation 53B in plan view is, for example, equal to or more than 10 degrees. When the unit cell 91A and the unit cell 91B are identical and have an n-fold rotational symmetry, the upper limit of the angle between the orientation 53A and the orientation 53B is less than 360/n degrees. When each unit cell has n-fold symmetries for a plurality of n's, the largest one of the n's is used to determine the upper limit of the angle. For example, a hexagonal lattice has a 2-fold rotational symmetry, a 3-fold rotational symmetry, and a 6-fold rotational symmetry. In this case, "6" is used for the n defining the upper limit of the angle. Specifically, when the unit cells 91A and 91B are each a hexagonal lattice, the angle between the orientation 53A and the orientation 53B is less than 60 degrees. The phononic crystal structure A includes at least two phononic crystal regions having different unit cell orientations. The phononic crystal structure A may further include any other phononic crystal regions and/or regions having no phononic crystal structure so long as the above condition is met.

The orientation of a unit cell can be determined based on any rule. However, it is necessary that the same rule be applied to different domains to determine the orientations of their unit cells. The orientation of a unit cell is, for example, the extending direction of a straight line bisecting the angle between two non-parallel sides included in the unit cell. However, it is necessary to use the same rule for different domains to define their two sides.

Figure 9:
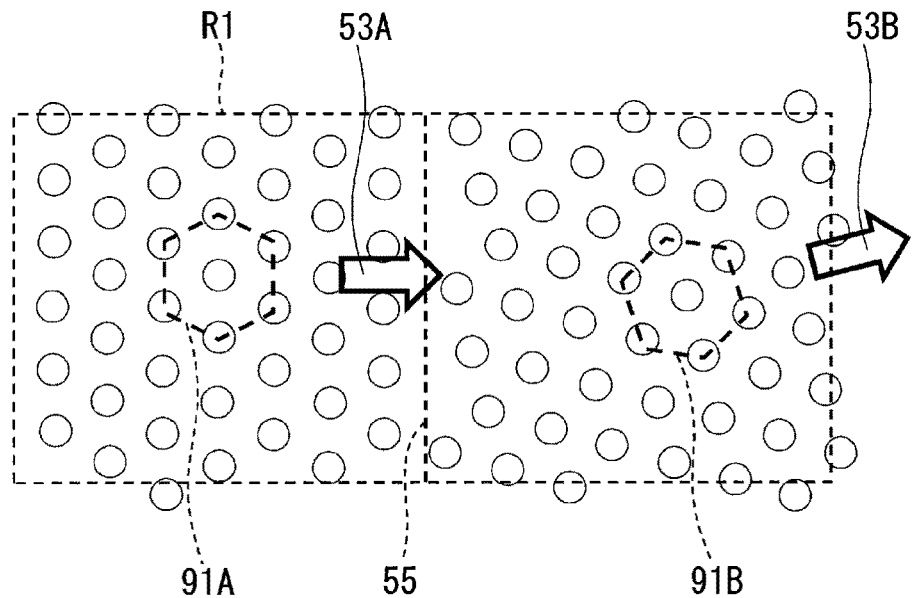
FIG. 9 is an enlarged view of region R1 in the phononic crystal structure in FIG. 7.

FIG. 9 shows an enlarged view of region R1 in the phononic crystal structure A in FIG. 7. The orientations 53A and 53B of the unit cells 91A and 91B change at the interface 55 between the first domain 51A and the second domain 51B adjacent to each other. The interface 55 at which the orientations of the unit cells change has a large interface resistance to heat macroscopically flowing through the phononic crystal structure A. The interface resistance is based on a mismatch between the group velocity of phonons in the first domain 51A and the group velocity of phonons in the second domain 51B. The interface resistance contributes to a reduction in the thermal conductivity of the phononic crystal layer 56 having the phononic crystal structure A. In FIG. 9, the interface 55 extends linearly in plan view. The interface 55 extends in the width direction of the rectangular phononic crystal layer 56 in plan view. The width direction may be a direction perpendicular to the extending direction of the centerline of the phononic crystal layer 56 that is determined by the direction of macroscopic heat transfer. The interface 55 divides the phononic crystal structure A in a direction substantially perpendicular to the direction of macroscopic heat transfer in plan view.

In the phononic crystal structure A in FIG. 7, the period P of the arrangement of the plurality of through holes 50 in the first domain 51A is the same as the period P of the arrangement of the plurality of through holes 50 in the second domain 51B.

In the phononic crystal structure A in FIG. 7, the diameter of the plurality of through holes 50 regularly arranged in the first domain 51A is the same as the diameter of the plurality of through holes 50 regularly arranged in the second domain 51B.

In the phononic crystal structure A in FIG. 7, the type of unit cell 91A in the first domain 51A is the same as the type of unit cell 91B in the second domain 51B. The unit cell 91A and the unit cell 91B in FIG. 7 are each a hexagonal lattice.

No limitation is imposed on the number of domains included in the phononic crystal structure A. The larger the number of domains included in the phononic crystal structure A, the larger the effect of the interface resistance at the interfaces between domains.

Other examples of the phononic crystal structure A will be shown.

Figure 10:
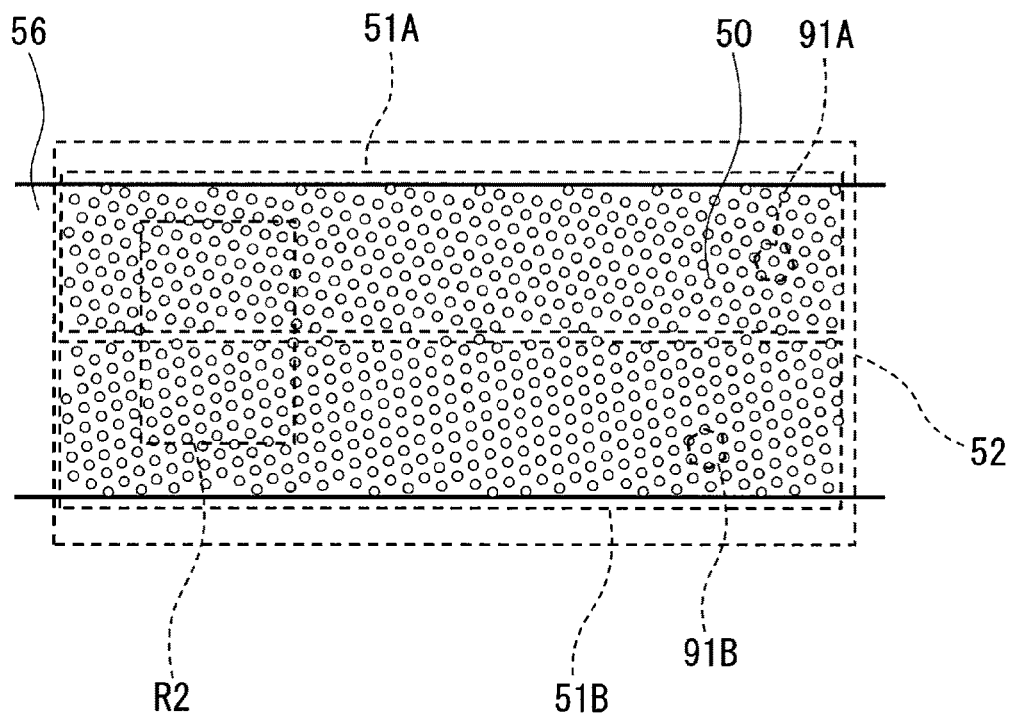
FIG. 10 is a plan view schematically showing another example of the phononic crystal structure that the thermoelectric conversion element of the present disclosure can have.
Figure 11:
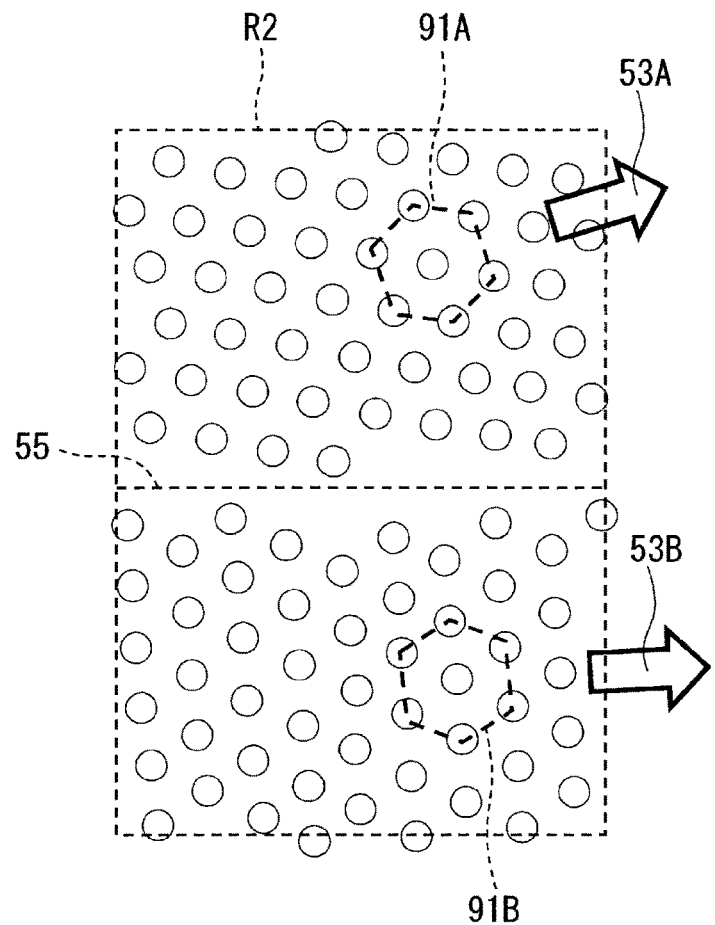
FIG. 11 is enlarged view of region R2 in the phononic crystal structure in FIG. 10.

In a polycrystal structure 52 that is a phononic crystal structure A in FIGS. 10 and 11, the interface 55 between a first domain 51A and a second domain 51B adjacent to each other extends in the direction of the long sides of the rectangular phononic crystal layer 56 in plan view. The phononic crystal structure A in FIGS. 10 and 11 is structurally the same as the phononic crystal structure A in FIG. 7 except for the above feature. FIG. 11 is an enlarged view of region R2 in FIG. 10.

In the phononic crystal structures A in FIGS. 7 and 10, the size of the first domain 51A is the same as the size of the second domain 51B in plan view. However, the sizes of the first and second domains 51A and 51B included in a phononic structure A may differ from each other in plan view.

Figure 12:
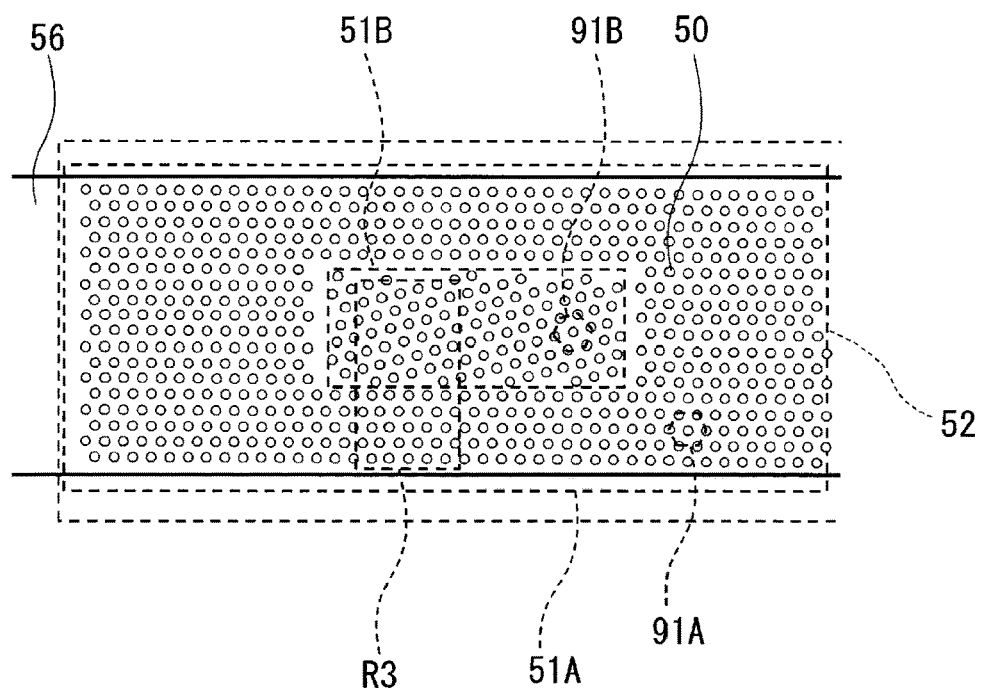
FIG. 12 is a plan view schematically showing yet another example of the phononic crystal structure that the thermoelectric conversion element of the present disclosure can have.
Figure 13:
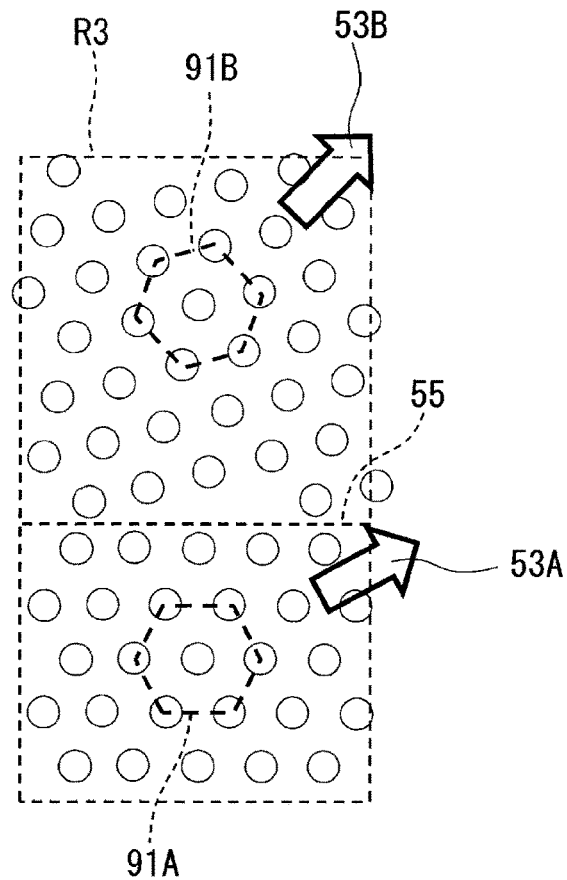
FIG. 13 is an enlarged view of region R3 in the phononic crystal structure in FIG. 12.

In a polycrystal structure 52 that is a phononic crystal structure A in FIGS. 12 and 13, a first domain 51B is surrounded by a second domain 51A in plan view. The first domain 51A has a rectangular outer shape in plan view. The second domain 51B has a rectangular shape in plan view. The size of the first domain 51A differs from the size of the second domain 51B in plan view. In plan view, the interface 55 between the second domain 51B and the first domain 51A surrounding the second domain 51B forms the outer edge of the second domain 51B. The phononic crystal structure A in FIGS. 12 and 13 is structurally the same as the phononic crystal structure A in FIG. 7 except for the above feature. FIG. 13 is an enlarged view of region R3 in FIG. 12.

In the phononic crystal structure A in FIGS. 12 and 13, the interface 55 has bent portions.

Moreover, the phononic crystal structure A in FIGS. 12 and 13 includes the second domain 51B that is not in contact with the sides of the phononic crystal layer 56.

Figure 14:
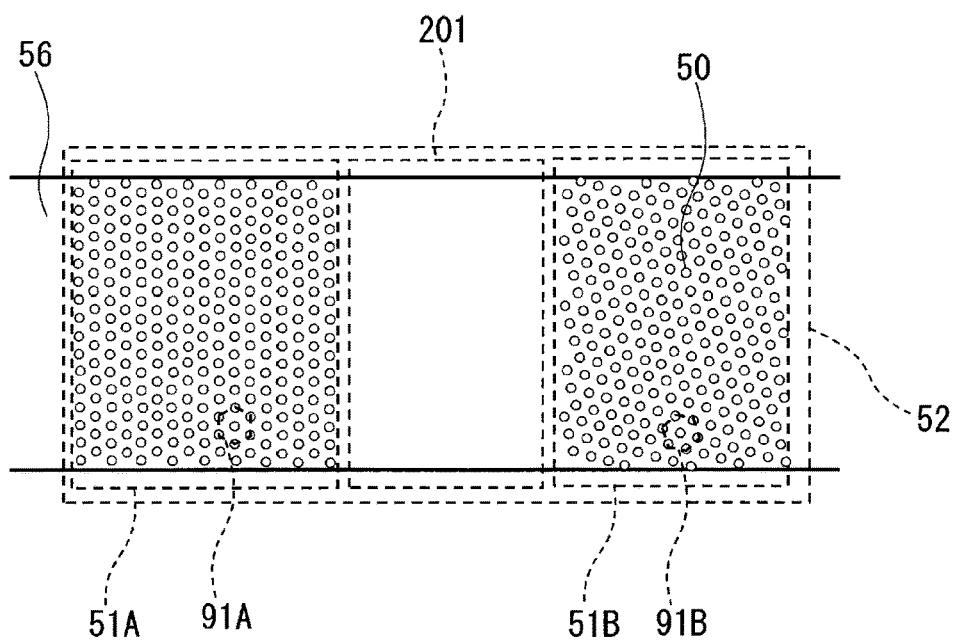
FIG. 14 is a plan view schematically showing still another example of the phononic crystal structure that the thermoelectric conversion element of the present disclosure can have.

In a polycrystal structure 52 that is a phononic crystal structure A in FIG. 14, a first domain 51A and a second domain 51B are disposed so as to be spaced apart from each other in plan view. More specifically, in plan view, a region 201 having no through holes 50 is disposed between the first domain 51A and the second domain 51B so as to extend in the long side direction of the phononic crystal layer 56. The phononic crystal structure A in FIG. 14 is structurally the same as the phononic crystal structure A in FIG. 7 except for the above feature.

Figure 15:
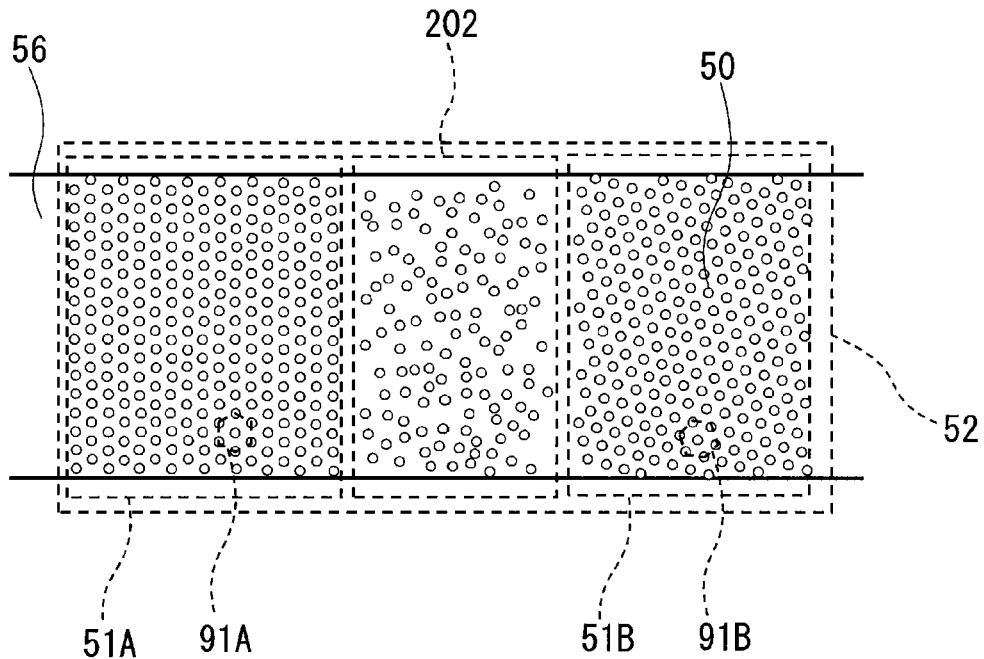
FIG. 15 is a plan view schematically showing even another example of the phononic crystal structure that the thermoelectric conversion element of the present disclosure can have.

In a polycrystal structure 52 that is a phononic crystal structure A in FIG. 15, a first domain 51A and a second domain 51B are disposed so as to be spaced apart from each other in plan view. More specifically, in plan view, a region 202 having randomly arranged through holes 50 is disposed between the first domain 51A and the second domain 51B so as to extend in the long side direction of the phononic crystal layer 56. In the region 202, the through holes 50 are not arranged regularly in plan view. Alternatively, in the region 202, the area of a regular arrangement region is, for example, less than 25 $P^2$ in plan view. Here, P is the period of the arrangement of the through holes 50. The phononic crystal structure A in FIG. 15 is structurally the same as the phononic crystal structure A in FIG. 7 except for the above feature.

Figure 16:
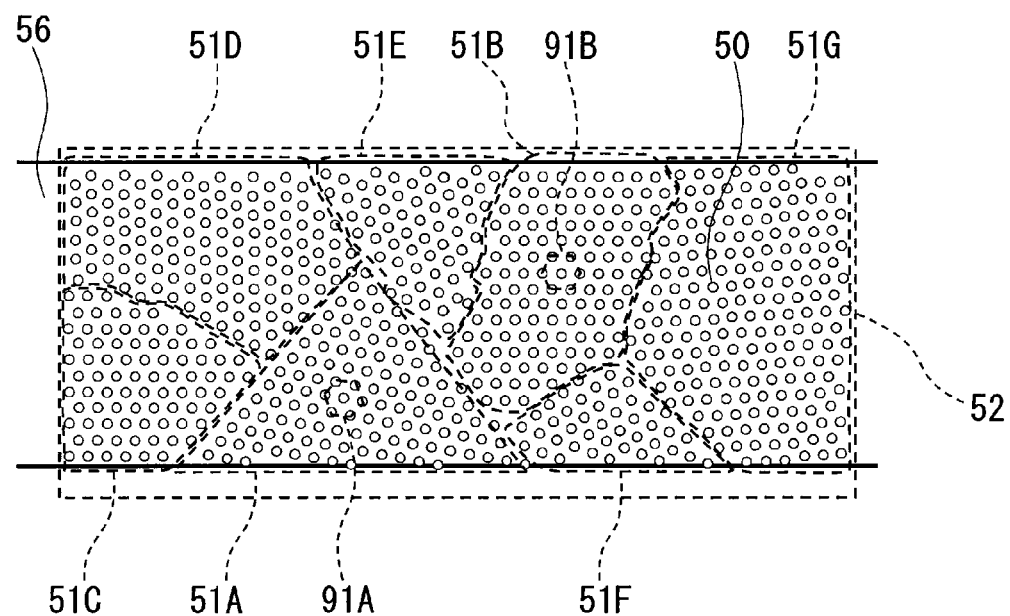
FIG. 16 is a plan view schematically showing even another example of the phononic crystal structure that the thermoelectric conversion element of the present disclosure can have.

A polycrystal structure 52 that is a phononic crystal structure A in FIG. 16 includes a plurality of domains 51A, 51B, 51C, 51D, 51E, 51F, and 51G having different shapes in plan view. In each of the domains, the period of the arrangement of a plurality of through holes 50 and the unit cell orientation are constant. However, the unit cell orientations of the domains differ from each other. In plan view, the sizes and shapes of the domains differ from each other. In this configuration, the number of unit cell orientations in the phononic crystal structure A as a whole is larger than that in the configurations exemplified above. Therefore, the effect of reducing the thermal conductivity that is based on the difference in unit cell orientation is more significant. In this configuration, interfaces 55 between the domains extend in a plurality of random directions in plan view. Therefore, the effect of reducing the thermal conductivity based on the interface resistance is more significant.

In the phononic crystal structure A in FIG. 16, the interface 55 between the first domain 51A and the second domain 51B adjacent to each other extends in a direction inclined with respect to the width direction of the phononic crystal layer 56 in plan view. The interfaces 55 also have bent portions in plan view.

Figure 17A:
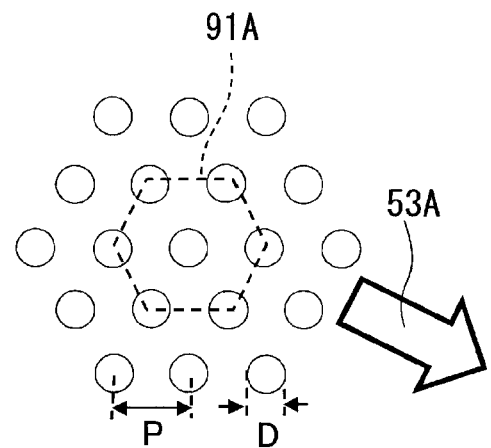
FIG. 17A is a schematic illustration showing an example of the unit cell of the phononic crystal structure that the thermoelectric conversion element of the present disclosure can have.
Figure 17B:
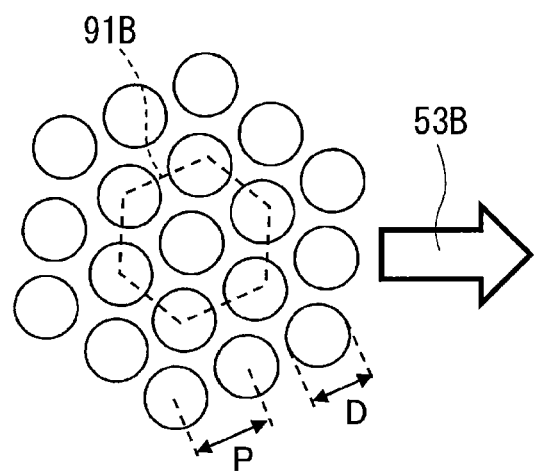
FIG. 17B is a schematic illustration showing another example of the unit cell of the phononic crystal structure that the thermoelectric conversion element of the present disclosure can have.

A polycrystal structure 52 that is a phononic crystal structure A may include a first domain 51A and a second domain 51B that differ in the period P of the arrangement of through holes 50 and/or in the diameter D of the through holes 50. The diameter D of through holes 50 in a first domain 51A shown in FIG. 17A differs from the diameter D of through holes 50 in a second domain 51B shown in FIG. 17B. The period P of the arrangement of the through holes 50 in the first domain 51A shown in FIG. 17A is the same as the period P of the arrangement of the through holes 50 in the second domain 51B shown in FIG. 17B.

Figure 18:
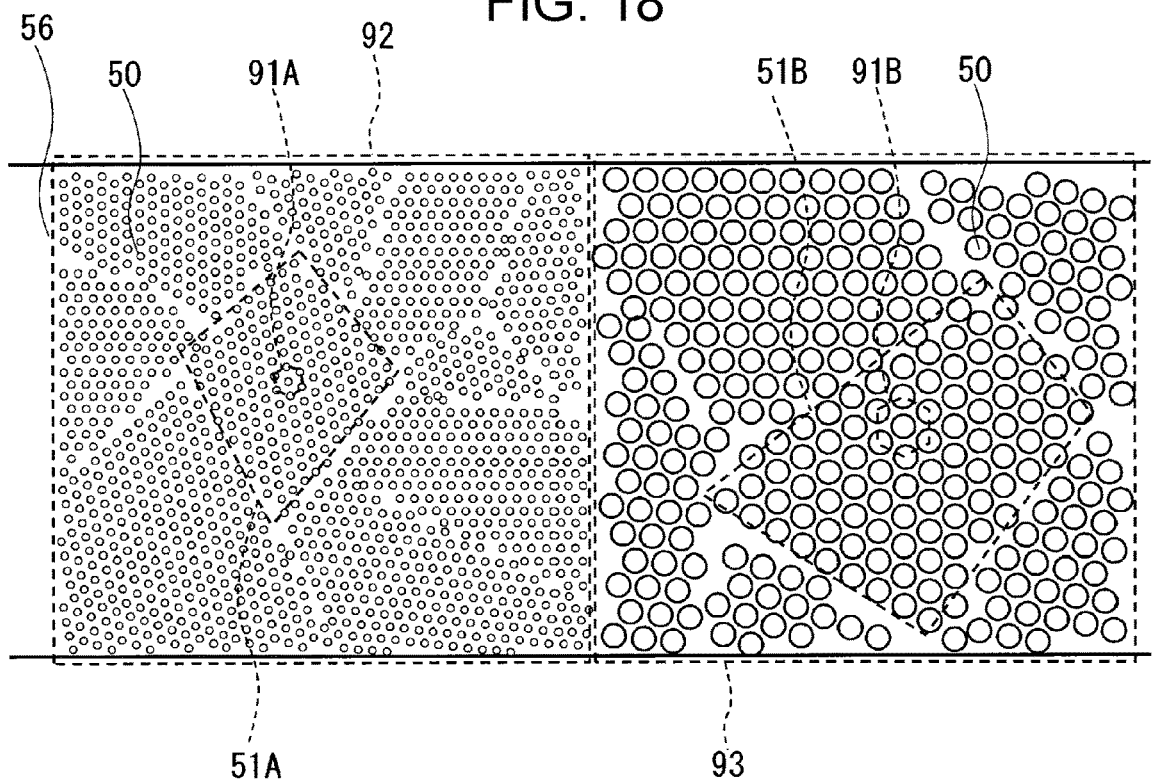
FIG. 18 is a plan view schematically showing even another example of the phononic crystal structure that the thermoelectric conversion element of the present disclosure can have.

A phononic crystal structure A shown in FIG. 18 has a first domain 51A in which a plurality of through holes 50 having a smaller diameter D are regularly arranged with a smaller period P and a second domain 51b in which a plurality of through holes 50 having a larger diameter D are regularly arranged with a larger period P. The phononic crystal structure A shown in FIG. 18 includes a region 92 including a plurality of through holes 50 with a smaller period P and a smaller diameter D and a region 93 including a plurality of through holes 50 with a larger period P and a larger diameter D. The region 92 is adjacent to the region 93. The region 92 and the region 93 each include a plurality of domains having different shapes and different unit cell orientations in plan view, as in the example shown in FIG. 16. The interface between the region 92 and the region 93 divides the phononic crystal structure A in a direction substantially perpendicular to the direction of macroscopic heat transfer. In this configuration, the frequency band of a PBG formed in the first domain 51A differs from the frequency band of a PBG formed in the second domain 51B, and therefore, the effect of reducing the thermal conductivity is particularly significant.

Figure 19:
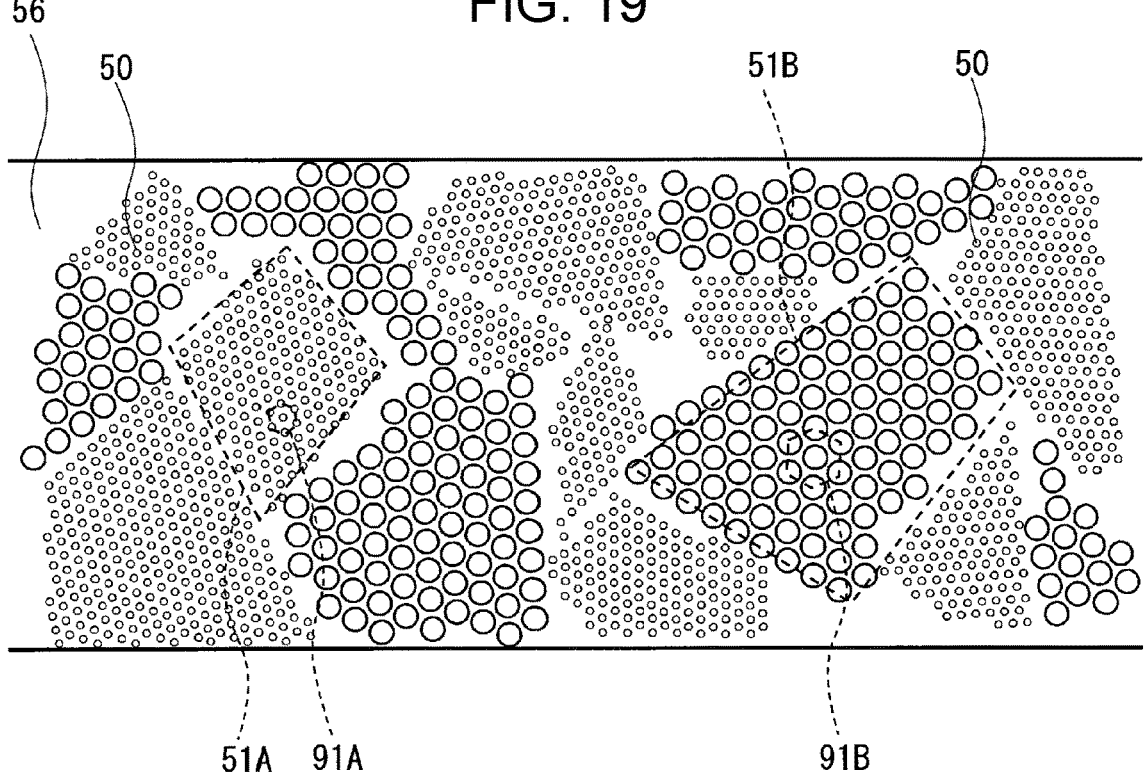
FIG. 19 is a plan view schematically showing even another example of the phononic crystal structure that the thermoelectric conversion element of the present disclosure can have.

A phononic crystal structure A shown in FIG. 19 includes a first domain 51A in which a plurality of through holes 50 having a smaller diameter D are regularly arranged with a smaller period P and a second domain 51b in which a plurality of through holes 50 having a larger diameter D are regularly arranged with a larger period P. The phononic crystal structure A in FIG. 19 includes a plurality of domains having different shapes in plan view and different unit cell orientations. In this configuration, the frequency band of a PBG formed in the first domain 51A differs from the frequency band of a PBG formed in the second domain 51B, and therefore the effect of reducing the thermal conductivity is particularly significant.

The phononic crystal layer 56 has, for example, a polygonal shape such as a triangular, square, or rectangular shape, a circular shape, an elliptical shape, or a combination thereof in plan view. However, the shape of the phononic crystal layer 56 is not limited to the above examples.

The p-type thermoelectric converter 2 and the n-type thermoelectric converter 3 each have, for example, a polygonal shape such as a triangular, square, or rectangular shape, a circular shape, an elliptical shape, or a combination thereof in plan view. However, the shape of the p-type thermoelectric converter 2 and the shape of the n-type thermoelectric converter 3 are not limited to the above examples. The p-type thermoelectric converter 2 and/or the n-type thermoelectric converter 3 may have a rectangular parallelepipedic or cubic shape.

The p-type thermoelectric converter 2 may include two or more first phononic crystal layers 16 and/or two or more third phononic crystal layers 20. The p-type thermoelectric converter 2 may further include a phononic crystal layer having a phononic crystal structure having a configuration different from those of the first phononic crystal structure and the third phononic crystal structure.

The n-type thermoelectric converter 3 may include two or more second phononic crystal layers 18 and/or two or more fourth phononic crystal layers 22. The n-type thermoelectric converter 3 may further include a phononic crystal layer having a phononic crystal structure having a configuration different from those of the second phononic crystal structure and the fourth phononic crystal structure.

The first electrode 4, the second electrode 5, and the third electrode 6 are each formed of a conductive material. The conductive material is typically a metal. The metal is, for example, chromium (Cr), aluminum (Al), gold (Au), silver (Ag), or copper (Cu).

The thermoelectric conversion element 1 may further include any layer other than those described above and/or a member. One example of the member is a base substrate. In one possible configuration of the thermoelectric conversion element 1, at least one member selected from the p-type thermoelectric converter 2, the n-type thermoelectric converter 3, the first electrode 4, the second electrode and the third electrode 6 is disposed on or inside the base substrate.

The base substrate is typically formed of a semiconductor material. The semiconductor material is, for example, Si. An oxide film may be formed on the upper surface of the base substrate formed of Si. The oxide film is, for example, a $SiO_2$ film. The base substrate may be a Si wafer. The structure of the base substrate is not limited to the above example.

Figure 20A:
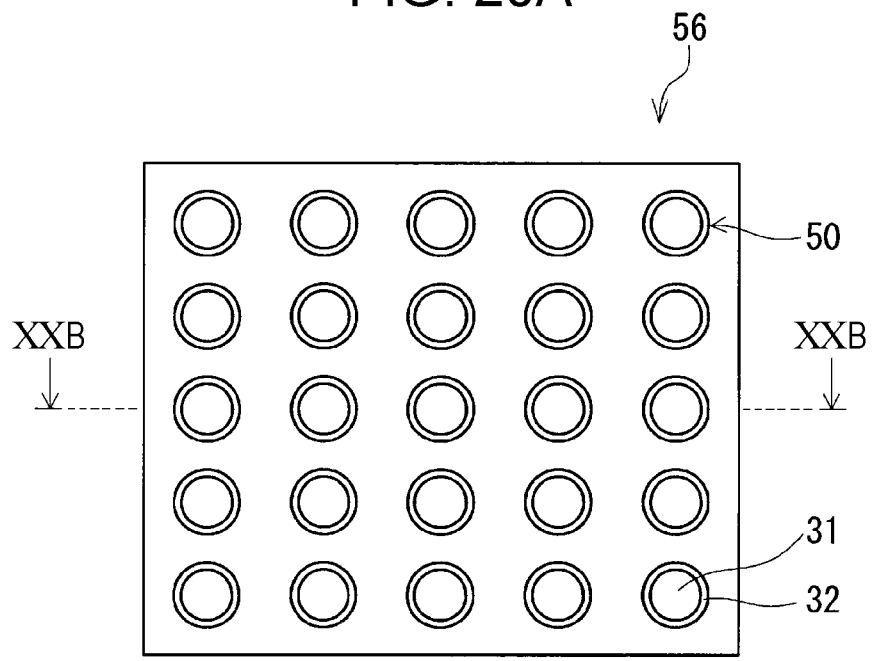
FIG. 20A is a plan view schematically showing an example of the phononic crystal layer that the thermoelectric conversion element of the present disclosure can have.
Figure 20B:
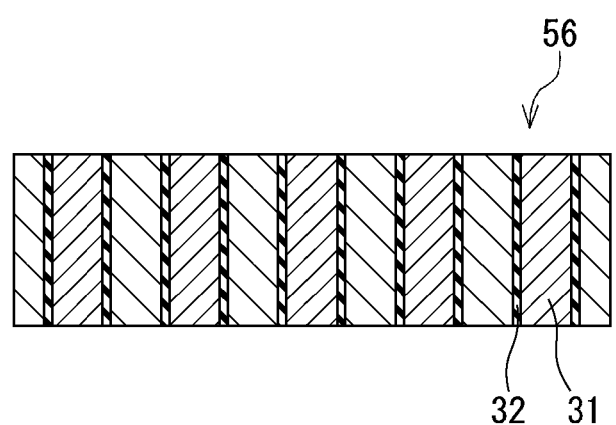
FIG. 20B is a cross-sectional view showing a cross section XXB-XXB of the phononic crystal layer in FIG. 20A.

Another example of the phononic crystal layer 56 is shown in FIGS. 20A and 20B. FIG. 20B shows a cross section XXB-XXB of the phononic crystal layer 56 in FIG. 20A. The phononic crystal layer 56 shown in FIGS. 20A and 20B further includes a plurality of pillars 31. The pillars 31 are columnar members extending linearly. Each of the pillars 31 is filed into a corresponding one of the through holes 50 in the phononic crystal layer 56. The circumferential surface of each of the pillars 31 is covered with an oxide film 32. In this configuration, the through holes 50 that are vacant holes are filled with the respective pillars 31. Therefore, for example, flexibility in controlling the characteristics of the through holes 56 in the through direction in the phononic crystal layer 56 can be increased. More specifically, for example, in a thermoelectric converter that is a stacked structure including two or more phononic crystal layers 56, the electron conductivity between a first end 11 or 13 and a second end 12 or 14 can be improved while the low thermal conductivity based on the phononic crystal structures is maintained.

When the pillars 31 and the phononic crystal layer 56 with the pillars 31 filled thereinto are formed of the same material, the circumferential surface of each of the pillars 31 is covered with the oxide film 32. When the pillars 31 and the phononic crystal layer 56 with the pillars 31 filled thereinto are formed of different materials, the oxide film 32 is not always necessary.

The phononic crystal layer 56 further including the pillars 31 is, for example, the first phononic crystal layer 16 and/or the second phononic crystal layer 18. The pillars 31 may be filled into both the first through holes 15 and the second through holes 17. The phononic crystal layer 56 further including the pillars 31 may be at least one phononic crystal layer selected from the first phononic crystal layer 16, the second phononic crystal layer 18, the third phononic crystal layer 20, and the fourth phononic crystal layer 22. The pillars 31 may be filled into the first through holes 15, the second through holes 17, the third through holes 19, and the fourth through holes 21.

Typically, the pillars 31 are formed of a semiconductor material. The material forming the pillars 31 is, for example, Si, SiGe, SiC, TiN, SiN, or $VO_2$. However, the material forming the pillars 31 is not limited to the above examples.

The oxide film 32 is, for example, a $SiO_2$ film. However, the oxide film 32 is not limited to the above example.

Figure 21:
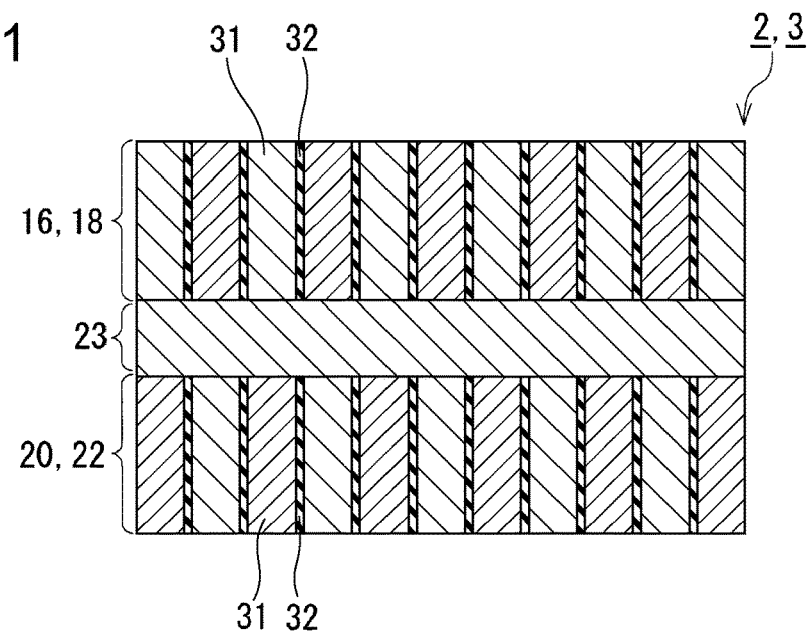
FIG. 21 is a cross-sectional view schematically showing another example of the p-type thermoelectric converter and/or the n-type thermoelectric converter that the thermoelectric conversion element of the present disclosure can have.

FIG. 21 shows an example of the p-type thermoelectric converter 2 (or the n-type thermoelectric converter 3) including the first phononic crystal layer 16 (or the second phononic crystal layer 18) with the pillars 31 filled thereinto and the third phononic crystal layer 20 (or the fourth phononic crystal layer 22) with the pillars 31 filled thereinto. The p-type thermoelectric converter 2 (or the n-type thermoelectric converter 3) in FIG. 21 includes the phononic crystal layers 56 shown in FIGS. 20A and 20B as the first phononic crystal layer 16 (or the second phononic crystal layer 18) and the third phononic crystal layers 20 (or the fourth phononic crystal layer 22). The p-type thermoelectric converter 2 (or the n-type thermoelectric converter 3) in FIG. 21 is a two-layer structure including two phononic crystal layers 56. A buffer layer 23 is disposed between the first phononic crystal layer 16 (or the second phononic crystal layer 18) and the third phononic crystal layer 20 (or the fourth phononic crystal layer 22). The material forming the pillars 31 (excluding the oxide film 32) in the first phononic crystal layer 16 (or the second phononic crystal layer 18) is the same as the material forming the buffer layer 23. The material forming the buffer layer 23 is the same as the material forming the third phononic crystal layer 20 (or the fourth phononic crystal layer 22) (excluding the pillars 31 and the oxide film 32).

Figure 22A:
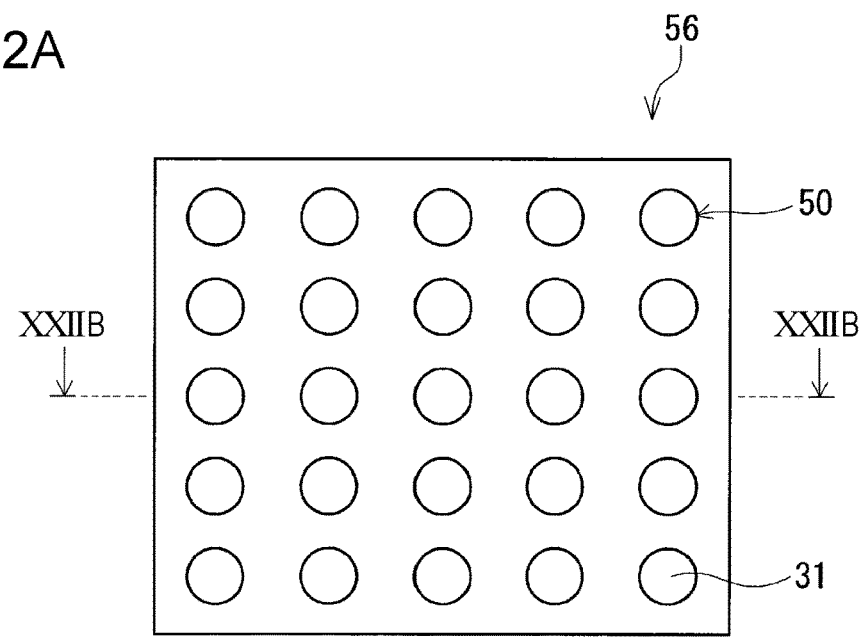
FIG. 22A is a plan view schematically showing another example of the phononic crystal layer that the thermoelectric conversion element of the present disclosure can have.
Figure 22B:
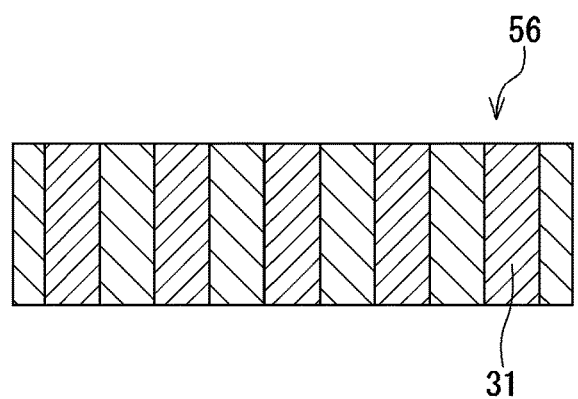
FIG. 22B is a cross-sectional view showing a cross section XXIIB-XXIIB of the phononic crystal layer in FIG. 22A.

Another example of the phononic crystal layer 56 is shown in FIGS. 22A and 22B. FIG. 22B shows a cross section XXIIB-XXIIB of the phononic crystal layer 56 in FIG. 22A. The phononic crystal layer 56 shown in FIGS. 22A and 22B further includes a plurality of pillars 31. Each of the pillars 31 is filled into a corresponding one of the through holes 50 in the phononic crystal layer 56. The material forming the pillars 31 differs from the material forming the phononic crystal layer 56.

Figure 23:
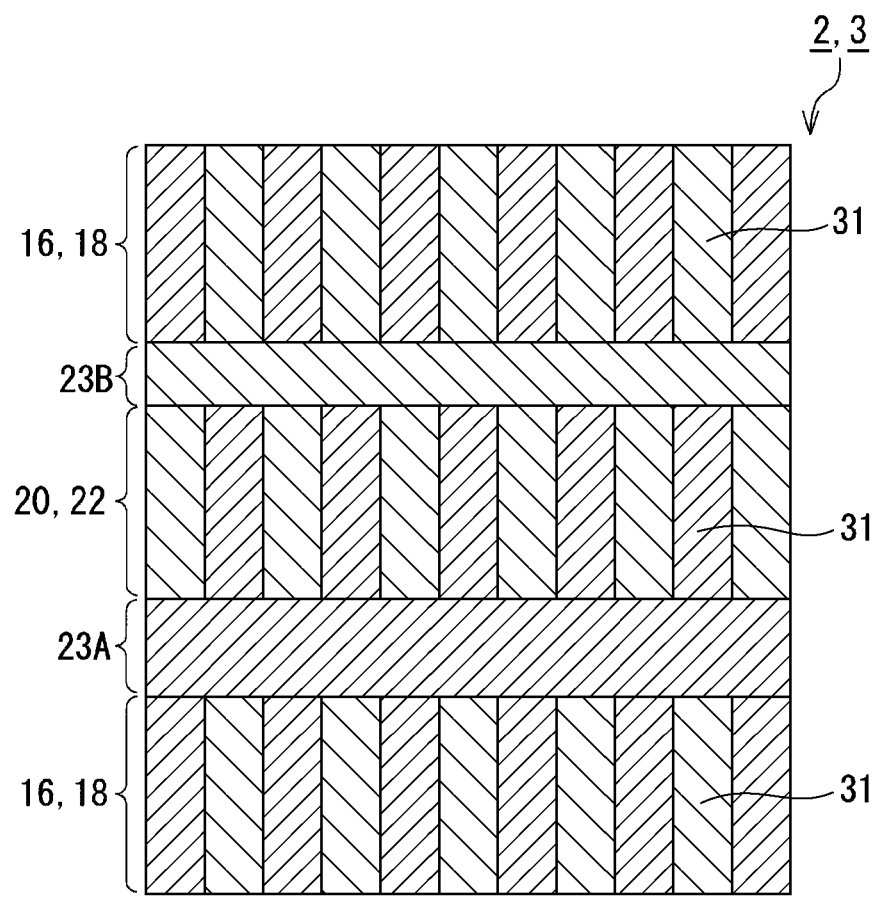
FIG. 23 is a cross-sectional view schematically showing yet another example of the p-type thermoelectric converter and/or the n-type thermoelectric converter that the thermoelectric conversion element of the present disclosure can have.

FIG. 23 shows an example of the p-type thermoelectric converter 2 (or the n-type thermoelectric converter 3) including the first phononic crystal layers 16 (or the second phononic crystal layers 18) with pillars 31 filled thereinto and the third phononic crystal layer 20 (or the fourth phononic crystal layer 22) with pillars 31 filled thereinto. The p-type thermoelectric converter 2 (or the n-type thermoelectric converter 3) in FIG. 23 is a three-layer structure which includes three phononic crystal layers 56 and in which a first phononic crystal layer 16 (or a second phononic crystal layer 18), a third phononic crystal layer 20 (or a fourth phononic crystal layer 22), and a first phononic crystal layer 16 (or a second phononic crystal layer 18) are disposed in this order. A first buffer layer 23A is disposed between the lowermost first phononic crystal layer 16 (or the lowermost second phononic crystal layer 18) and the third phononic crystal layer 20 (or the fourth phononic crystal layer 22). A second buffer layer 23B is disposed between the third phononic crystal layer 20 (or the fourth phononic crystal layer 22) and the uppermost first phononic crystal layer 16 (or the uppermost second phononic crystal layer 18). The material forming the pillars 31 in the first phononic crystal layers 16 (or the second phononic crystal layers 18) is the same as the material forming the second buffer layer 23B. The material forming the pillars 31 in the third phononic crystal layer 20 (or the fourth phononic crystal layer 22) is the same as the material forming the first buffer layer 23A. The material forming the first phononic crystal layers 16 (or the second phononic crystal layers 18) (excluding the pillars 31) is the same as the material forming the first buffer layer 23A. The material forming the third phononic crystal layer 20 (or the fourth phononic crystal layer 22) (excluding the pillars 31) is the same as the material forming the second buffer layer 23B. The p-type thermoelectric converter 2 (or the n-type thermoelectric converter 3) in FIG. 23 is formed from two types of materials. The two types of materials may be semiconductor materials.

The thermoelectric conversion element of the present disclosure can be produced using a combination of any of various thin film forming methods such as chemical vapor deposition (CVD), sputtering, and vapor deposition and any of various micromachining methods and pattern forming methods such as electron beam lithography, photolithography, block copolymer lithography, selective etching, and chemo-mechanical polishing (CMP). The block copolymer lithography is suitable for the formation of the phononic crystal structures.

An example of a method for producing the thermoelectric conversion element of the present disclosure will be described with reference to FIGS. 24A to 24O. However, the method for producing the thermoelectric conversion element of the present disclosure is not limited to the following example.

Figure 24A:
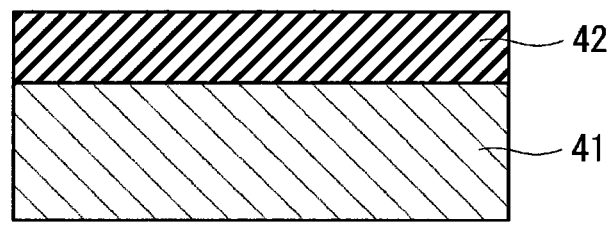
FIG. 24A is a schematic cross-sectional view illustrating an example of a method for producing the thermoelectric conversion element of the present disclosure.

FIG. 24A: A base substrate 41 is prepared. An oxide film 42 has been provided on the upper surface of the base substrate 41. The oxide film 42 is, for example, a $SiO_2$ film.

Figure 24B:
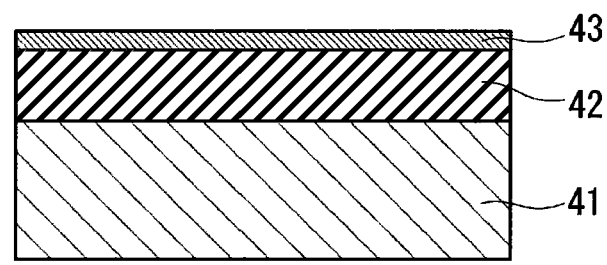
FIG. 24B is a schematic cross-sectional view illustrating the example of the method for producing the thermoelectric conversion element of the present disclosure.

FIG. 24B: A metal layer 43 is formed on the oxide film 42. The metal layer 43 later becomes the first electrode 4. The metal layer 43 is, for example, a Cr layer. The metal layer 43 is formed, for example, by sputtering. The thickness of the metal layer 43 is, for example, 50 nm.

Figure 24C:
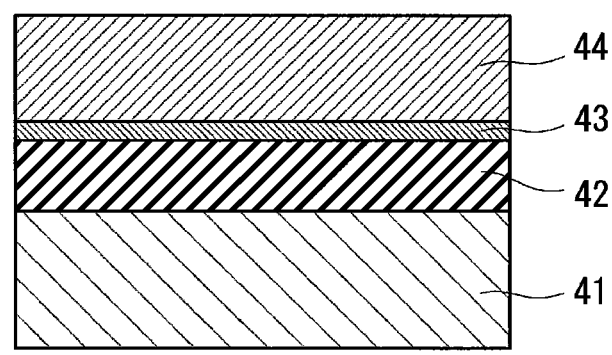
FIG. 24C is a schematic cross-sectional view illustrating the example of the method for producing the thermoelectric conversion element of the present disclosure.

FIG. 24C: A semiconductor layer 44 is formed on the metal layer 43. The semiconductor layer 44 is, for example, a polycrystalline Si layer. The semiconductor layer 44 is formed, for example, by CVD. The thickness of the semiconductor layer 44 is, for example, 200 nm.

Figure 24D:
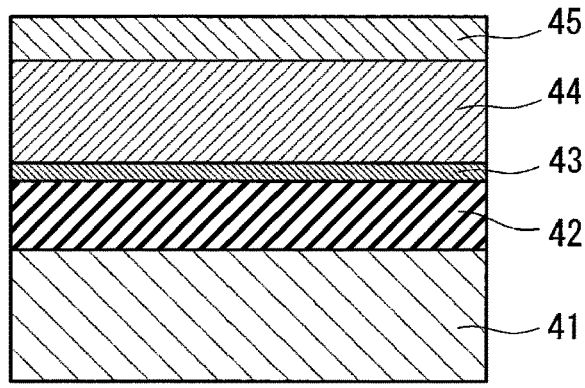
FIG. 24D is a schematic cross-sectional view illustrating the example of the method for producing the thermoelectric conversion element of the present disclosure.

FIG. 24D: A hard mask 45 is formed on the semiconductor layer 44. The hard mask 45 is, for example, a $SiO_2$ layer. The hard mask 45 is formed, for example, by CVD. The thickness of the hard mask 45 is, for example, 30 nm. The hard mask 45 is used to form a phononic crystal structure in the semiconductor layer 44.

Figure 24E:
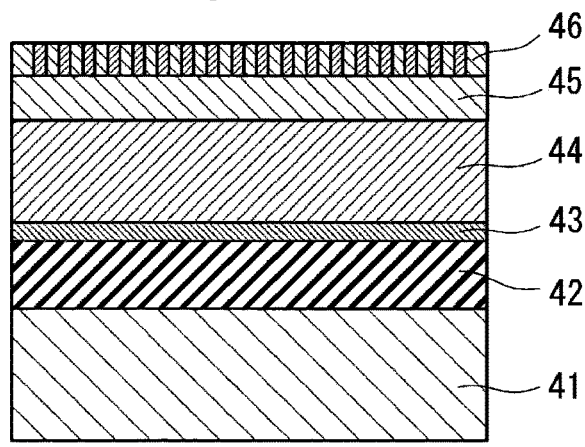
FIG. 24E is a schematic cross-sectional view illustrating the example of the method for producing the thermoelectric conversion element of the present disclosure.

FIG. 24E: A self-assembled film 46 of a block copolymer is formed on the hard mask 45. The self-assembled film 46 is used for block copolymer lithography for forming a phononic crystal structure.

Figure 24F:
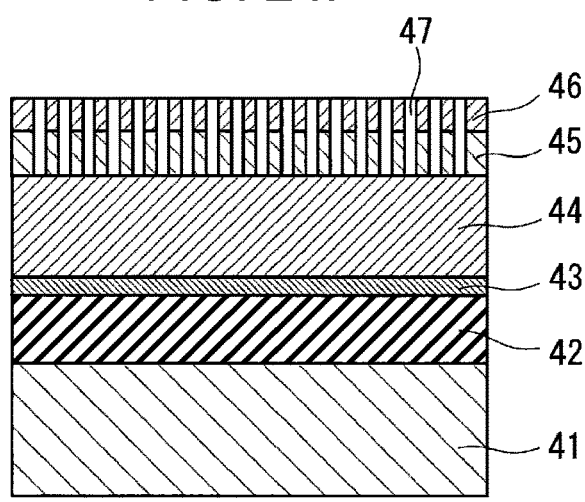
FIG. 24F is a schematic cross-sectional view illustrating the example of the method for producing the thermoelectric conversion element of the present disclosure.

FIG. 24F: A plurality of regularly arranged through holes 47 are formed in the hard mask 45 by block copolymer lithography.

Figure 24G:
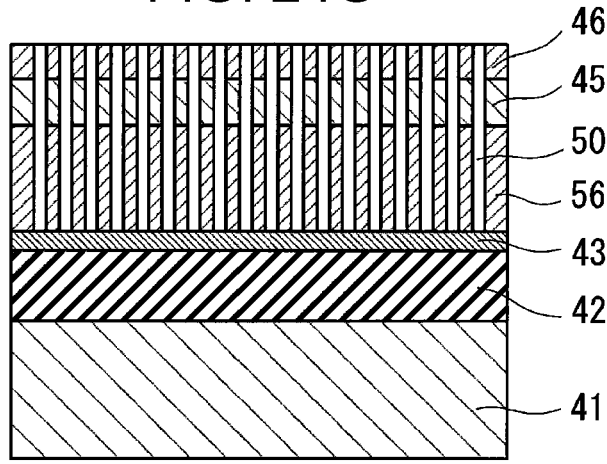
FIG. 24G is a schematic cross-sectional view illustrating the example of the method for producing the thermoelectric conversion element of the present disclosure.

FIG. 24G: A plurality of regularly arranged through holes 50 are formed in the semiconductor layer 44 by selective etching using the hard mask 45 as a resist at positions corresponding to the plurality of through holes 47 in plan view. The plurality of through holes 50 form a phononic crystal structure. The semiconductor layer 44 later becomes the phononic crystal layer 56.

Figure 24H:
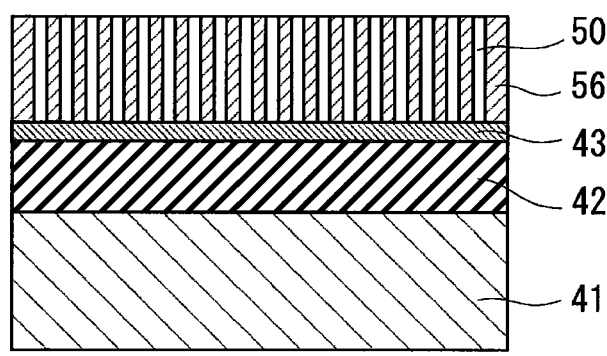
FIG. 24H is a schematic cross-sectional view illustrating the example of the method for producing the thermoelectric conversion element of the present disclosure.

FIG. 24H: The hard mask 45 and the self-assembled film 46 are removed.

Figure 24I:
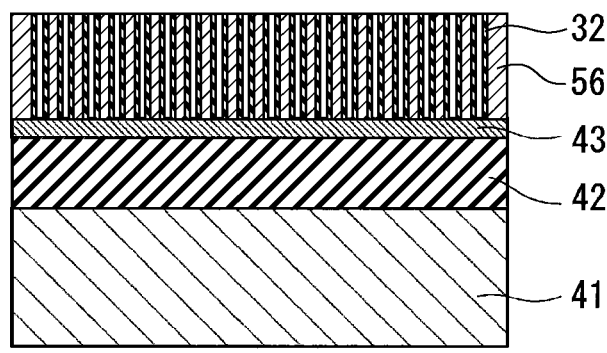
FIG. 24I is a schematic cross-sectional view illustrating the example of the method for producing the thermoelectric conversion element of the present disclosure.

FIG. 24I: An oxide film 32 is formed on the inner circumferential surface of each of the through holes 50 in the phononic crystal layer 56. The oxide film 32 is, for example, a $SiO_2$ film. The oxide film 32 is formed, for example, by thermal oxidation. The thickness of the oxide film 32 is, for example, 1 nm.

Figure 24J:
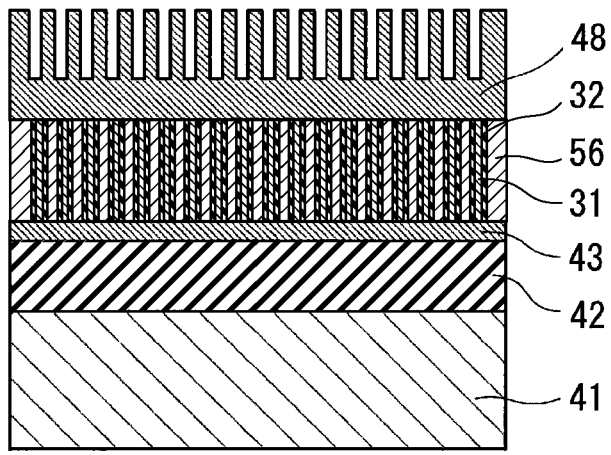
FIG. 24J is a schematic cross-sectional view illustrating the example of the method for producing the thermoelectric conversion element of the present disclosure.

FIG. 24J: The through holes 50 in the phononic crystal layer 56 are filled with a semiconductor to form pillars 31 having the oxide film 32 on their circumferential surface. The pillars 31 are formed of, for example, polycrystalline Si. The pillars 31 are formed, for example, by CVD. In this case, a layer 48 formed of the semiconductor material forming the pillars 31 is formed on the phononic crystal layer 56.

Figure 24K:
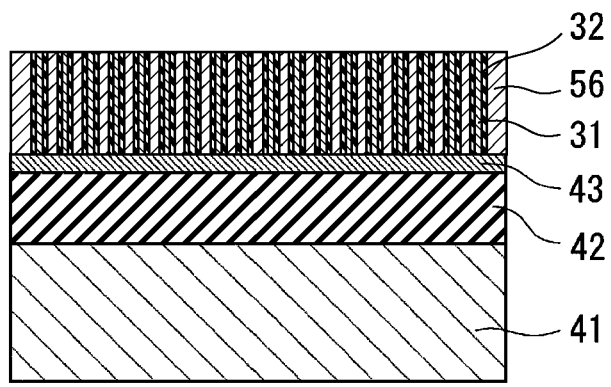
FIG. 24K is a schematic cross-sectional view illustrating the example of the method for producing the thermoelectric conversion element of the present disclosure.

FIG. 24K: The layer 48 is removed by a method such as CMP. In this manner, the phononic crystal layer 56 further including the pillars 31 is formed.

Figure 24L:
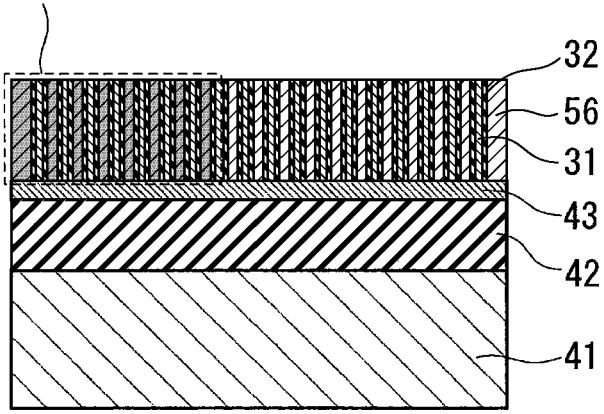
FIG. 24L is a schematic cross-sectional view illustrating the example of the method for producing the thermoelectric conversion element of the present disclosure.

FIG. 24L: Impurity ions are implanted into a partial region of the phononic crystal layer 56 using a method such as photolithography to dope the partial region with the impurity ions, and a p-type thermoelectric converter 2 is thereby formed. The impurity ions are, for example, boron ions.

Figure 24M:
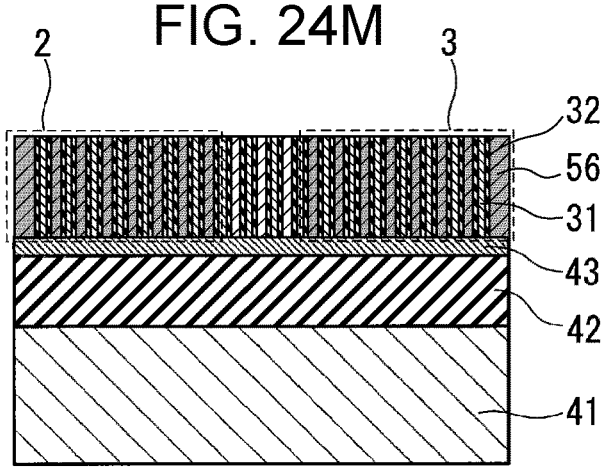
FIG. 24M is a schematic cross-sectional view illustrating the example of the method for producing the thermoelectric conversion element of the present disclosure.

FIG. 24M: Impurity ions are implanted into a region of the phononic crystal layer 56 that differs from the p-type thermoelectric converter 2 using a method such as photolithography to dope the region with the impurity ions, and an n-type thermoelectric converter 3 is thereby formed. The impurity ions are, for example, phosphorus ions. The p-type thermoelectric converter 2 is spaced apart from the n-type thermoelectric converter 3.

Figure 24N:
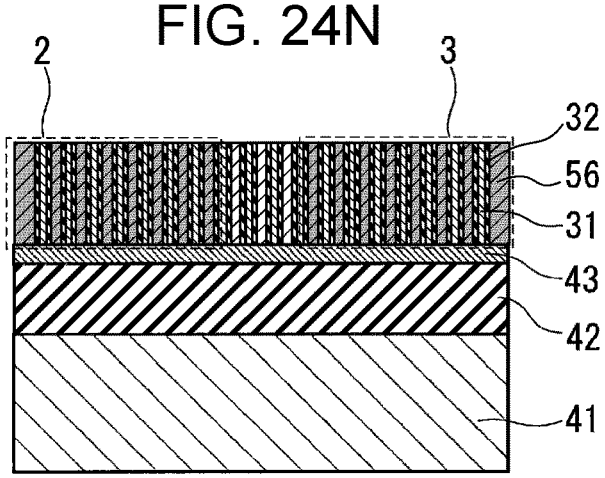
FIG. 24N is a schematic cross-sectional view illustrating the example of the method for producing the thermoelectric conversion element of the present disclosure.

FIG. 24N: The entire product is subjected to heat treatment (annealing) to activate the dopant impurity ions.

Figure 24O:
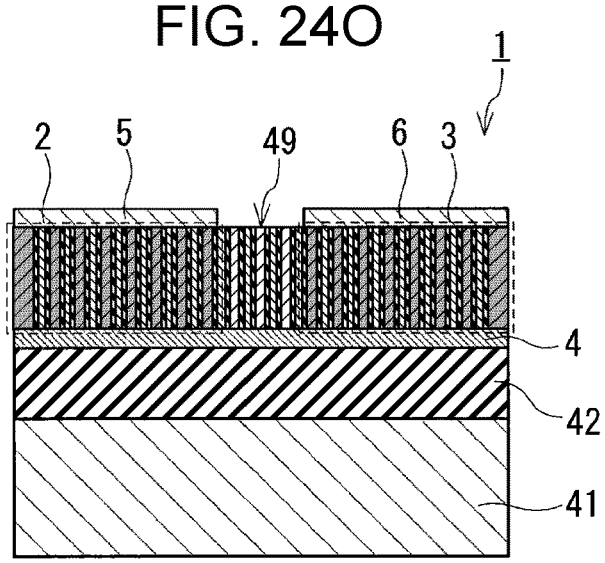
FIG. 24O is a schematic cross-sectional view illustrating the example of the method for producing the thermoelectric conversion element of the present disclosure.

FIG. 24O: A second electrode 5 is formed on the p-type thermoelectric converter 2. A third electrode 6 is formed on the n-type thermoelectric converter 3. The second electrode 5 and the third electrode 6 are formed of, for example, Al. A thermoelectric conversion element 1 is thereby formed. A region of the phononic crystal layer 56 that remains present between the p-type thermoelectric converter 2 and the n-type thermoelectric converter 3 serves as an insulating portion 49. The insulating portion 49 has a phononic crystal structure (fifth phononic crystal structure) including a plurality of regularly arranged through holes (fifth through holes) 50. In this configuration, the in-plane thermal conductivity of a portion of the element 1 that is located between the p-type thermoelectric converter 2 and the n-type thermoelectric converter 3 can be reduced. The reduction in the in-plane thermal conductivity allows the thermoelectric conversion efficiency of the thermoelectric conversion element 1 to be further improved.

Second Embodiment

Figure 25:
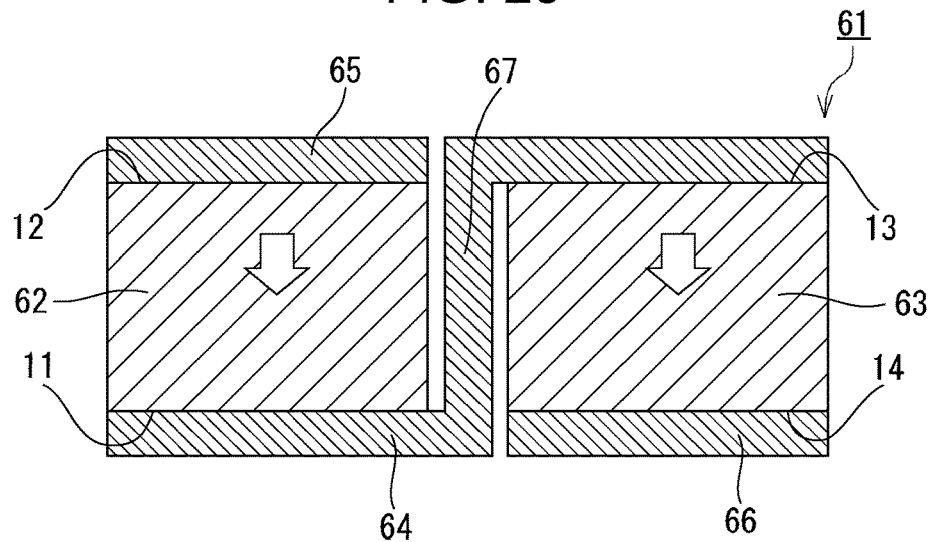
FIG. 25 is a cross-sectional view schematically showing another example of the thermoelectric conversion element of the present disclosure.

FIG. 25 shows an example of a thermoelectric conversion element in a second embodiment. The thermoelectric conversion element 1 in the first embodiment includes the pair of thermoelectric converters including the p-type thermoelectric converter 2 and the n-type thermoelectric converter 3 in one element and is referred to as a 7 C type element by those skilled in the art. However, the thermoelectric conversion element of the present disclosure is not limited to the 7 C type element. The thermoelectric conversion element in the second embodiment differs from the 7 C type element.

The thermoelectric conversion element 61 in FIG. 25 includes two thermoelectric converters 62 and 63 adjacent to each other. The thermoelectric converters 62 and 63 have the same conductivity type. In other words, the thermoelectric conversion element 61 includes two p-type thermoelectric converters or two n-type thermoelectric converters adjacent to each other. The thermoelectric conversion element 61 further includes a fourth electrode 64, a fifth electrode 65, and a sixth electrode 66. A first end 11 of the thermoelectric converter 62 is electrically connected to a first end 13 of the thermoelectric converter 63 through the fourth electrode 64. The fourth electrode 64 electrically connects the lower surface of the thermoelectric converter 62 to the upper surface of the thermoelectric converter 63. Therefore, the fourth electrode 64 includes a via wiring line 67 extending in a direction extending between the first ends 11 and 13 of the thermoelectric converters 62 and 63 and second ends 12 and 14 thereof. When an electric current is caused to flow between the fifth electrode 65 and the sixth electrode 66, the directions of the current flowing through the thermoelectric converters 62 and 63 are the same (see arrows in FIG. 25). The thermoelectric conversion element 61 is known as a uni-leg type element to those skilled in the art. In the uni-leg type element, for example, a problem that can occur in a 7 C type element because of the difference in thermal expansion coefficient between the p-type thermoelectric converter and the n-type thermoelectric converter can be avoided. The thermoelectric converters 62 and 63 may be formed of the same thermoelectric conversion material.

The thermoelectric converter 62 can include any of the above-described phononic crystal layers that the p-type thermoelectric converter 2 or the n-type thermoelectric converter 3 can have. The thermoelectric converter 63 can include any of the above-described phononic crystal layers that the p-type thermoelectric converter 2 or the n-type thermoelectric converter 3 can have. The phononic crystal layer included in the thermoelectric converter 62 and the phononic crystal layer included in the thermoelectric converter 63 may be the same or different. The thermoelectric conversion element 61 can have any known uni-leg type structure so long as the thermoelectric converters 62 and 63 each have a phononic crystal layer.

The material forming the thermoelectric converters 62 and 63 may be the same as the material forming the p-type thermoelectric converter 2 or the n-type thermoelectric converter 3. The material forming the fourth electrode 64, the fifth electrode 65, and the sixth electrode 66 may be the same as the material forming the first electrode 4, the second electrode 5, and the third electrode 6.

[Thermoelectric Conversion Device]

The thermoelectric conversion device of the present disclosure includes: a substrate; a first insulating layer disposed on the substrate; a thermoelectric conversion module disposed on the first insulating layer; a second insulating layer disposed on the thermoelectric conversion module; a first wiring line; and a second wiring line. The thermoelectric conversion module includes a thermoelectric conversion element assembly including two or more thermoelectric conversion elements and a pair of connection electrodes connected to the thermoelectric conversion element assembly. The two or more thermoelectric conversion elements are electrically connected in series between the pair of connection electrodes. The first wiring line is electrically connected to a first one of the connection electrodes. The second wiring line is electrically connected to a second one of the connection electrodes. Each thermoelectric conversion element is the above-described thermoelectric conversion element of the present disclosure.

In the thermoelectric conversion module, the two or more thermoelectric conversion elements are typically arranged in an array. The array may be a one-dimensional array, a two-dimensional array, or a three-dimensional array.

Figure 26A:
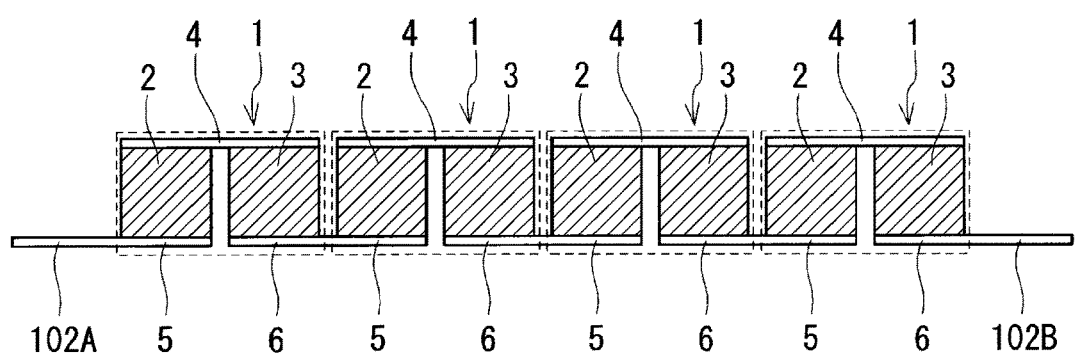
FIG. 26A is a cross-sectional view schematically showing an example of a thermoelectric conversion module that the thermoelectric conversion device of the present disclosure can have.

FIG. 26A shows an example of the thermoelectric conversion module that the thermoelectric conversion device of the present disclosure can have. The thermoelectric conversion module 101(101A) in FIG. 26A includes a thermoelectric conversion element assembly including two or more thermoelectric conversion elements 1. The thermoelectric conversion module 101A further includes a pair of connection electrodes 102A and 102B connected to the thermoelectric conversion element assembly. The connection electrode 102A is connected to the second electrode 5 of the thermoelectric conversion element 1 located at a first end of the thermoelectric conversion module 101A. The connection electrode 102B is connected to the third electrode 6 of the thermoelectric conversion element 1 located at a second end of the thermoelectric conversion module 101A. The two or more thermoelectric conversion elements 1 are electrically connected in series between the pair of connection electrodes 102A and 102B. In the thermoelectric conversion module 101A, the two or more thermoelectric conversion elements 1 are arranged in a one-dimensional array.

Figure 26B:
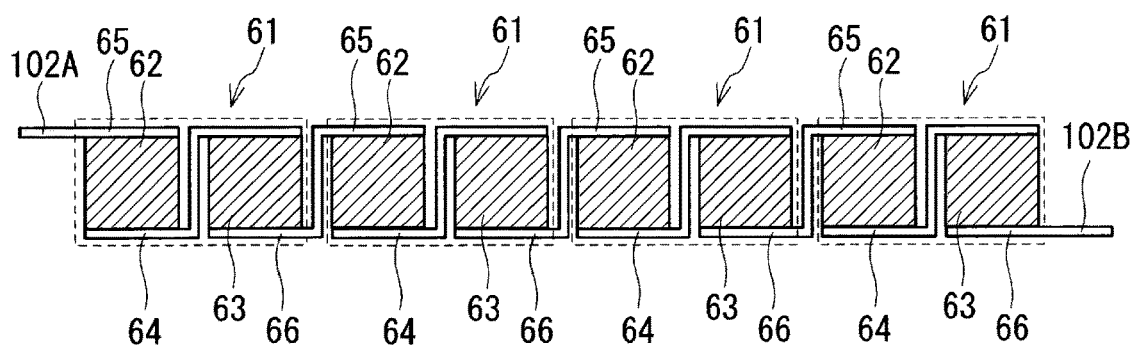
FIG. 26B is a cross-sectional view schematically showing another example of the thermoelectric conversion module that the thermoelectric conversion device of the present disclosure can have.

FIG. 26B shows another example of the thermoelectric conversion module that the thermoelectric conversion device of the present disclosure can have. The thermoelectric conversion module 101(101B) in FIG. 26B includes a thermoelectric conversion element assembly including two or more thermoelectric conversion elements 61. The thermoelectric conversion module 101B further includes a pair of connection electrodes 102A and 102B connected to the thermoelectric conversion element assembly. The connection electrode 102A is connected to the fifth electrode 65 of the thermoelectric conversion element 61 located at a first end of the thermoelectric conversion module 101B. The connection electrode 102B is connected to the sixth electrode 66 of the thermoelectric conversion element 61 located at a second end of the thermoelectric conversion module 101A. The two or more thermoelectric conversion elements 61 are electrically connected in series between the pair of connection electrodes 102A and 102B. In the thermoelectric conversion module 101B, the two or more thermoelectric conversion elements 61 are arranged in a one-dimensional array.

Figure 27:
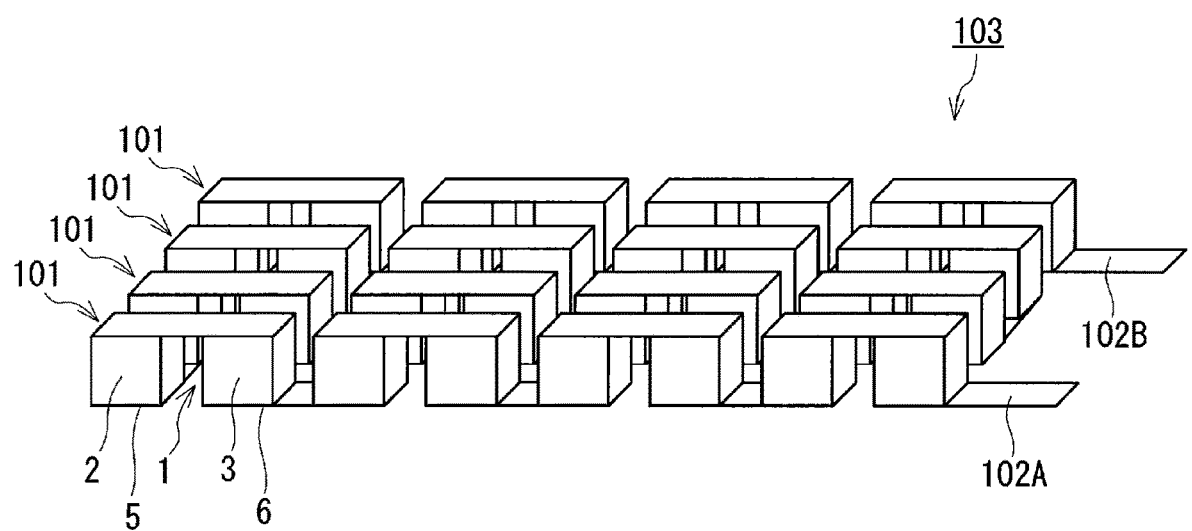
FIG. 27 is a perspective view schematically illustrating another example of the thermoelectric conversion module that the thermoelectric conversion device of the present disclosure can have.

FIG. 27 shows another example of the thermoelectric conversion module that the thermoelectric conversion device of the present disclosure can have. The thermoelectric conversion module 103 in FIG. 27 includes a thermoelectric conversion element assembly including two or more thermoelectric conversion elements 1. The thermoelectric conversion module 103 further includes a pair of connection electrodes 102A and 102B connected to the thermoelectric conversion element assembly. The two or more thermoelectric conversion elements 1 are electrically connected in series between the pair of connection electrodes 102A and 102B. In the thermoelectric conversion module 103, the two or more thermoelectric conversion elements 1 are arranged in a two-dimensional array. The thermoelectric conversion module 103 can also be regarded as having two or more thermoelectric conversion modules 101. In this point of view, in the thermoelectric conversion module 103, four thermoelectric conversion modules 101 are arranged in a plane. In the example in FIG. 27, each thermoelectric conversion module 101 is the thermoelectric conversion module 101A in FIG. 26A including two or more thermoelectric conversion elements 1. At least one thermoelectric conversion module 101 may be the thermoelectric conversion module 101B in FIG. 26B including two or more thermoelectric conversion elements 61.

Figure 28:
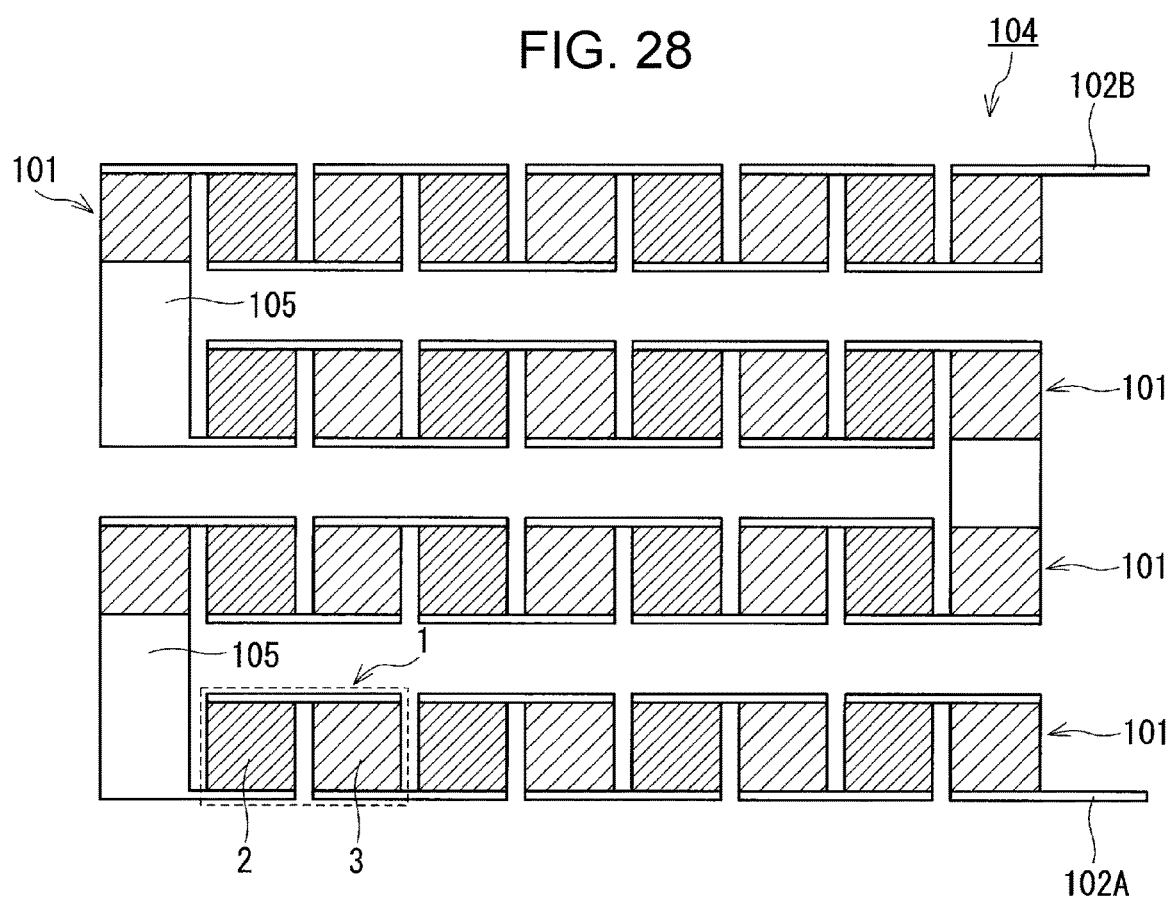
FIG. 28 is a cross-sectional view schematically showing yet another example of the thermoelectric conversion module that the thermoelectric conversion device of the present disclosure can have.

FIG. 28 shows another example of the thermoelectric conversion module that the thermoelectric conversion device of the present disclosure can have. The thermoelectric conversion module 104 shown in FIG. 28 includes a thermoelectric conversion element assembly including two or more thermoelectric conversion elements 1. The thermoelectric conversion module 104 further includes a pair of connection electrodes 102A and 102B connected to the thermoelectric conversion element assembly. The two or more thermoelectric conversion elements 1 are electrically connected in series between the pair of connection electrodes 102A and 102B using bus electrodes 105. In the thermoelectric conversion module 104, the two or more thermoelectric conversion elements 1 are arranged in a three-dimensional array. The thermoelectric conversion module 104 can also be regarded as having two or more thermoelectric conversion modules 101. In this point of view, in the thermoelectric conversion module 104, four thermoelectric conversion modules 101 are arranged in four layers in the thickness direction of the thermoelectric conversion module 104. In the example in FIG. 28, each thermoelectric conversion module 101 is the thermoelectric conversion module 101A in FIG. 26A including two or more thermoelectric conversion elements 1. At least one thermoelectric conversion module 101 may be the thermoelectric conversion module 101B in FIG. 26B including two or more thermoelectric conversion elements 61.

Figure 29:
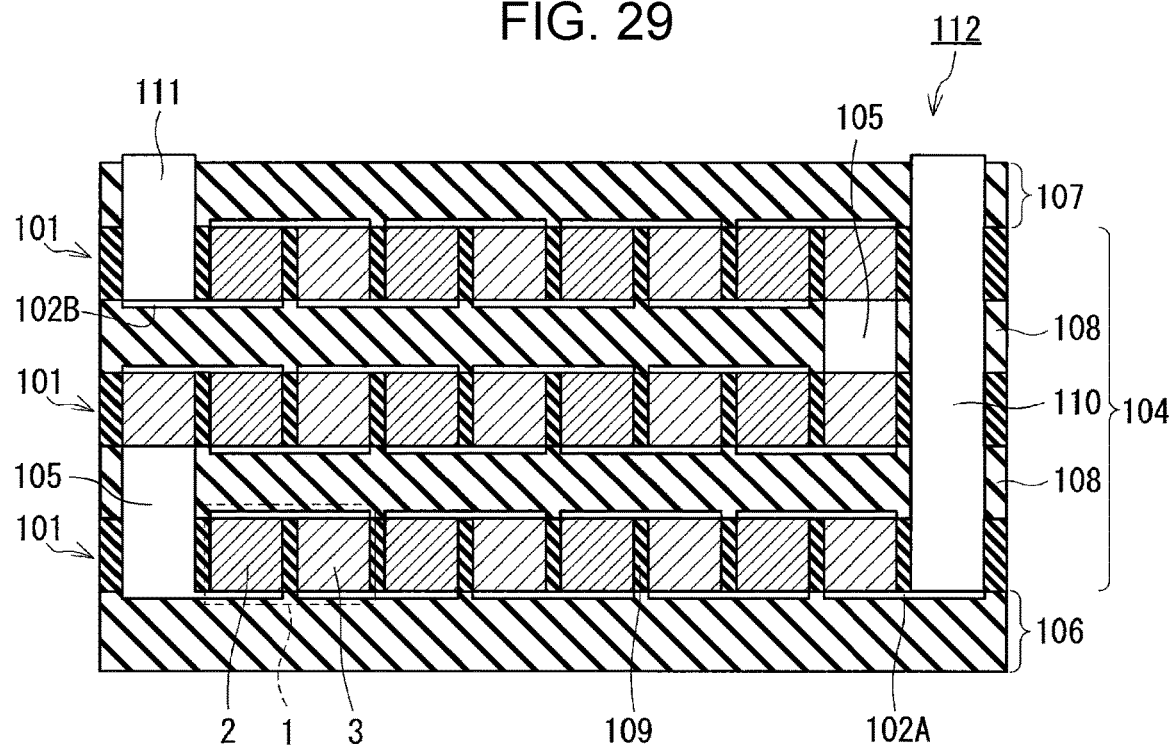
FIG. 29 is a cross-sectional view schematically showing an example of the thermoelectric conversion device of the present disclosure.

FIG. 29 shows an example of the thermoelectric conversion device of the present disclosure. The thermoelectric conversion device 112 shown in FIG. 29 includes a first insulating layer 106, a thermoelectric conversion module 104 disposed on the first insulating layer 106, and a second insulating layer 107 disposed on the thermoelectric conversion module 104. This thermoelectric conversion module 104 is the same as the thermoelectric conversion module 104 shown in FIG. 28 except that three thermoelectric conversion module 101 are arranged in three layers in the thickness direction of the thermoelectric conversion module 104. However, in the thermoelectric conversion module 104 in FIG. 29, an insulating layer 108 is disposed between adjacent thermoelectric conversion modules 101. Insulating portions 109 are disposed between the p-type thermoelectric converters 2 and the n-type thermoelectric converters 3 that are the thermoelectric converters forming the thermoelectric conversion elements 1 included in the thermoelectric conversion module(s) 101 or 104. Insulating portions 109 are disposed also between the two or more thermoelectric conversion elements 1. The insulating portions 109 may be disposed only between the p-type thermoelectric converters 2 and the n-type thermoelectric converters 3 or only between the two or more thermoelectric conversion elements 1. The thermoelectric conversion device 112 further includes a first wiring line 110 and a second wiring line 111. The first wiring line 110 is electrically connected to the connection electrode 102A of the thermoelectric conversion module 104. The second wiring line 111 is electrically connected to the connection electrode 102B of the thermoelectric conversion module 104. The thermoelectric conversion device 112 is disposed, for example, on or inside a substrate (base substrate). The thermoelectric conversion device 112 can function as a Peltier type cooling device and/or a thermoelectric generator with the first wiring line 110 and the second wiring line 111 used as an input wiring line and an output wiring line. In the example in FIG. 29, each thermoelectric conversion module 101 is the thermoelectric conversion module 101A in FIG. 26A including two or more thermoelectric conversion elements 1. At least one thermoelectric conversion module 101 may be the thermoelectric conversion module 101B in FIG. 26B including two or more thermoelectric conversion elements 61. In this case, the insulating portions 109 in the thermoelectric conversion module 101B may be located between the thermoelectric converters 62 and 63 included in the thermoelectric conversion elements 61 and/or between the two or more thermoelectric conversion elements 61.

Figure 30:
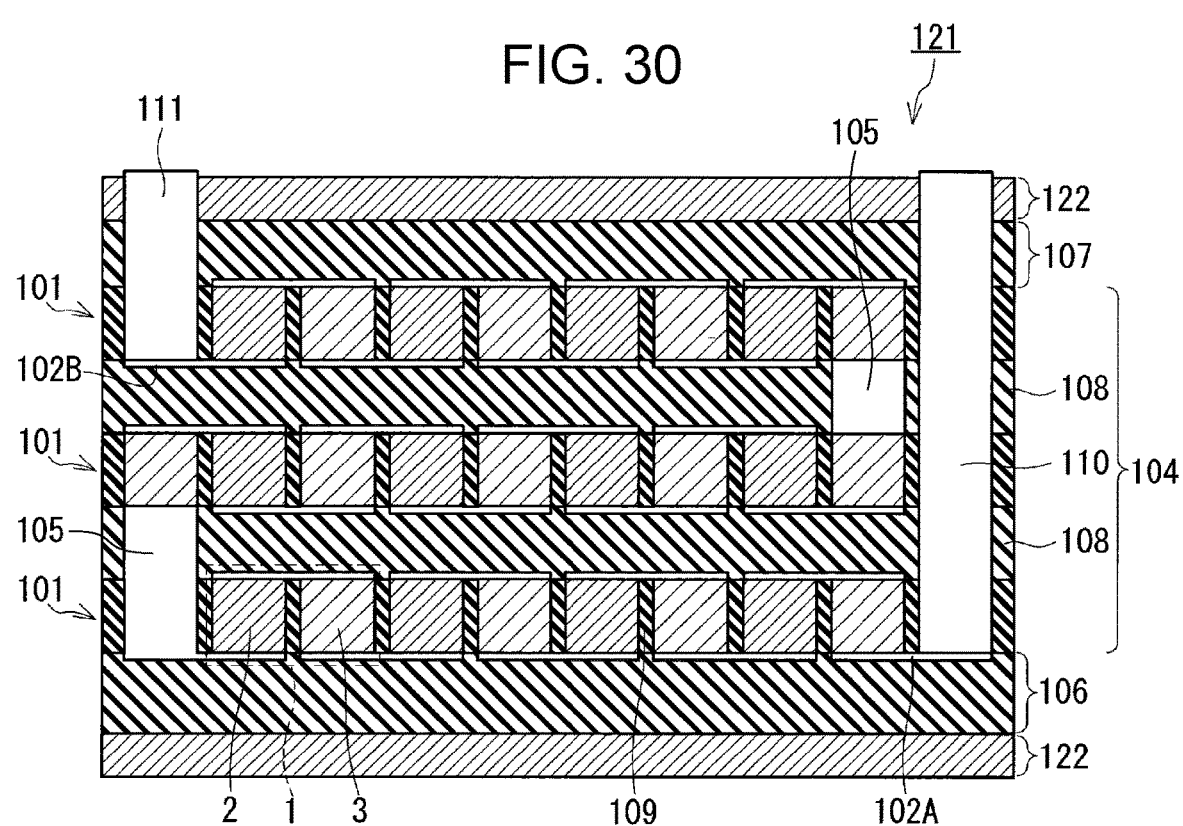
FIG. 30 is a cross-sectional view schematically showing an example of the thermoelectric conversion device of the present disclosure.

FIG. 30 shows another example of the thermoelectric conversion device of the present disclosure. The thermoelectric conversion device 121 shown in FIG. 30 has a structure in which the thermoelectric conversion device 112 shown in FIG. 29 is disposed inside a substrate 122.

Figure 31:
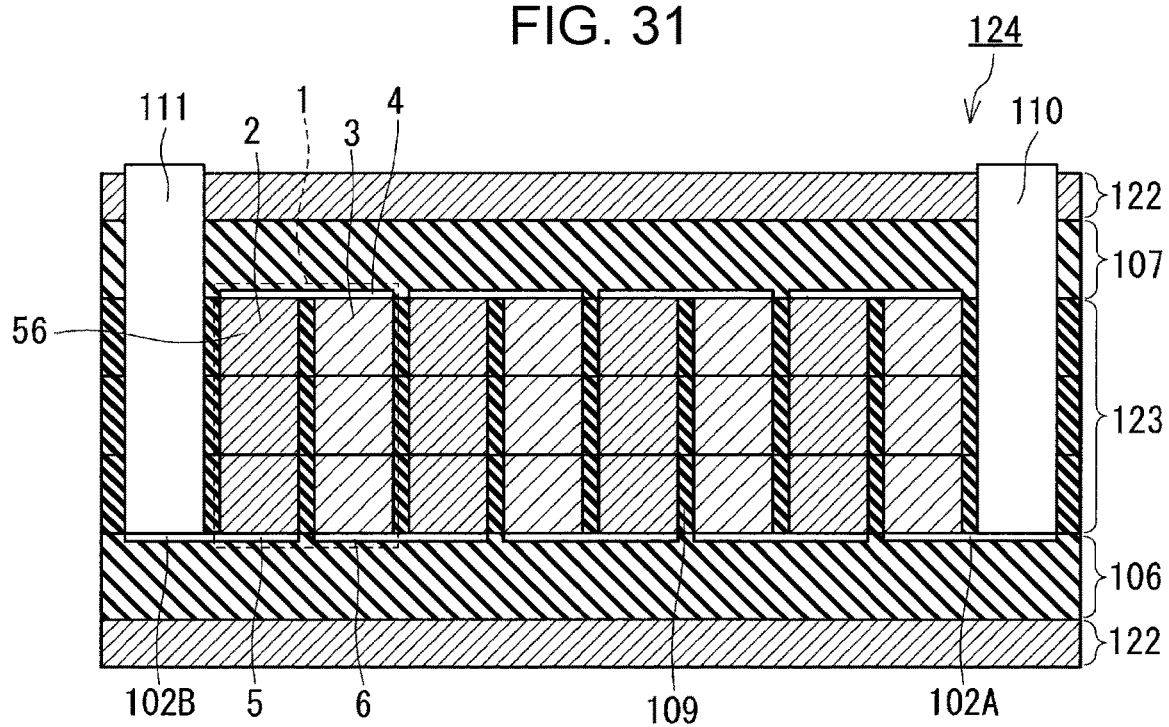
FIG. 31 is a cross-sectional view schematically showing an example of the thermoelectric conversion device of the present disclosure.

FIG. 31 shows another example of the thermoelectric conversion device of the present disclosure. The thermoelectric conversion device 124 shown in FIG. 31 includes a first insulating layer 106, a thermoelectric conversion module 123 disposed on the first insulating layer 106, and a second insulating layer 107 disposed on the thermoelectric conversion module 123. The thermoelectric conversion module 123 is the same as the thermoelectric conversion module 101(101A) shown in FIG. 26A except that the p-type thermoelectric converter 2 and the n-type thermoelectric converter 3 in each thermoelectric conversion element 1 each have a stacked structure including three phononic crystal layers 56. In the thermoelectric conversion module 123 in FIG. 31, insulating portions 109 are disposed between the p-type thermoelectric converters 2 and the n-type thermoelectric converters 3 of the thermoelectric conversion elements 1 and between the two or more thermoelectric conversion elements 1. The thermoelectric conversion device 124 further includes a first wiring line 110 and a second wiring line 111. The first wiring line 110 is electrically connected to the connection electrode 102A of the thermoelectric conversion module 123. The second wiring line 111 is electrically connected to the connection electrode 102B of the thermoelectric conversion module 123. The thermoelectric conversion device 124 is disposed inside a substrate 122. The thermoelectric conversion module 123 may be the thermoelectric conversion module 101(101B) in FIG. 26B. In this case, the thermoelectric conversion module 123 is the same as a module having a stacked structure in which the thermoelectric converters 62 and 63 each include three phononic crystal layers 56.

Figure 32:
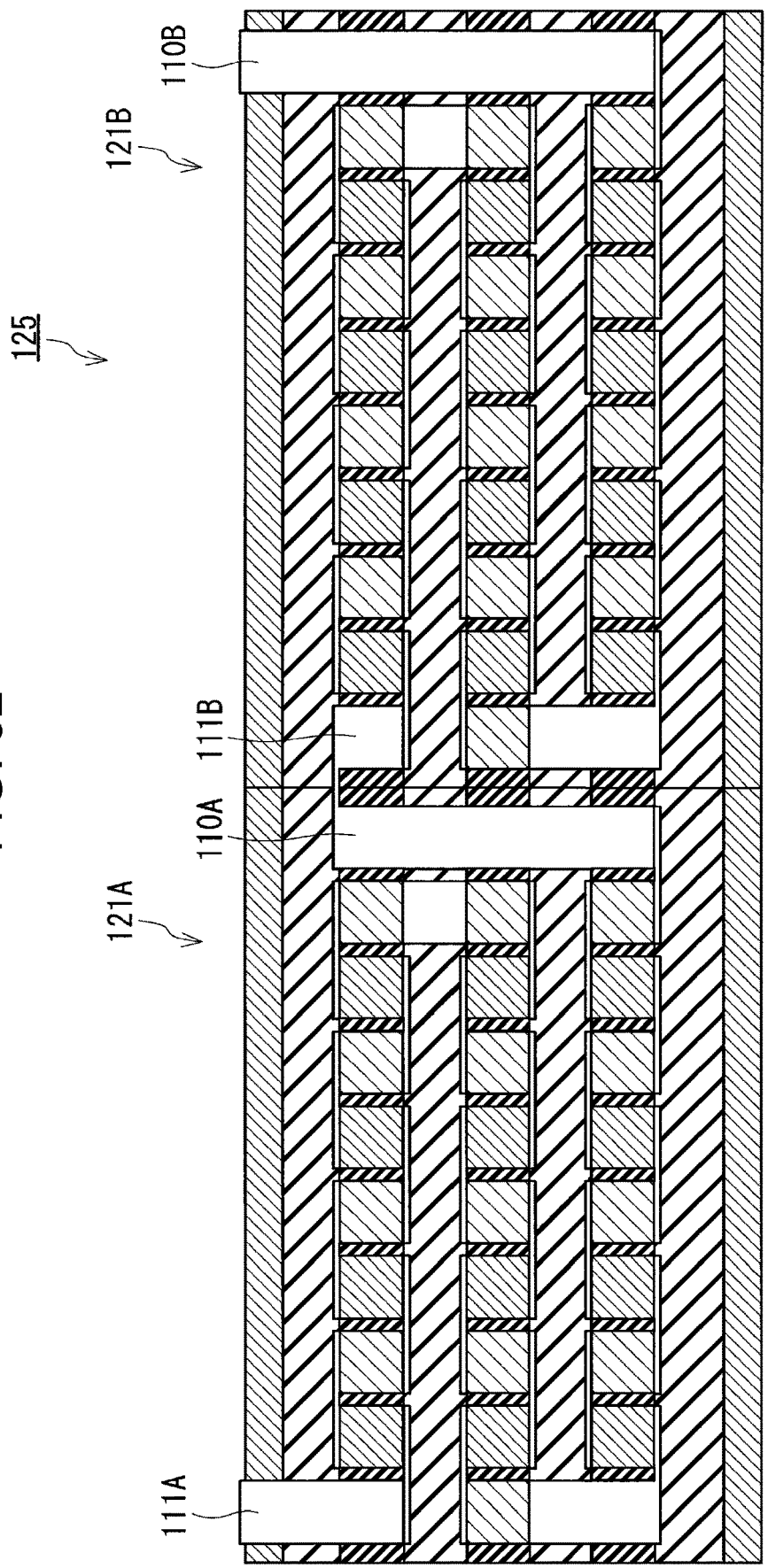
FIG. 32 is a cross-sectional view schematically showing an example of the thermoelectric conversion device of the present disclosure.

FIG. 32 shows another example of the thermoelectric conversion device of the present disclosure. The thermoelectric conversion device 125 shown in FIG. 32 has a structure in which two thermoelectric conversion devices 121A and 121B are electrically connected in series. Each of the thermoelectric conversion devices 121A and 121B is the thermoelectric conversion device 121 shown in FIG. 30. The thermoelectric conversion device 121A includes a first wiring line 110A and a second wiring line 111A. The thermoelectric conversion device 121B includes a first wiring line 110B and a second wiring line 111B. The thermoelectric conversion device 121A and the thermoelectric conversion device 121B are electrically connected in series through the first wiring line 110A and the second wiring line 111B. The first wiring line 110B functions as a first wiring line 110 of the thermoelectric conversion device 125. The second wiring line 111A functions as a second wiring line 111 of the thermoelectric conversion device 125.

Two or more thermoelectric conversion devices of the present disclosure can be combined freely. Two or more thermoelectric conversion devices of the present disclosure may be combined in a cascade manner. No limitation is imposed on the form of the cascade connection.

The material forming the first insulating layer 106, the second insulating layer 107, the insulating layers 108, and the insulating portions 109 is an oxide such as $SiO_2$. However, the material forming the first insulating layer 106, the second insulating layer 107, the insulating layers 108, and the insulating portions 109 is not limited to the above example.

The material forming the connection electrodes 102A and 102B, the first wiring line 110, and the second wiring line 111 is a metal such as Cr, Al, Au, Ag, or Cu. However, the material forming the connection electrodes 102A and 102B, the first wiring line 110, and the second wiring line 111 is not limited to the above examples.

In the thermoelectric conversion device of the present disclosure, each insulating portion 109 may have a fifth phononic crystal structure including a plurality of regularly arranged fifth through holes. In other words, in the thermoelectric conversion device of the present disclosure, each thermoelectric conversion module may include insulating portions 109 disposed between the thermoelectric converters included in the thermoelectric conversion elements and/or between the two or more thermoelectric conversion elements, and each insulating portion 109 may have the fifth phononic crystal structure including a plurality of regularly arranged fifth through holes. In this configuration, the in-plane thermal conductivity of the thermoelectric conversion elements can be further reduced. The reduction in the in-plane thermal conductivity allows the thermoelectric conversion efficiency of the thermoelectric conversion device to be further improved.

In the thermoelectric conversion device of the present disclosure, at least one selected from the substrate 122, the first insulating layer 106, the second insulating layer 107, the insulating layers 108, the first wiring line 110, and the second wiring line 111 may have a sixth phononic crystal structure including a plurality of regularly arranged sixth through holes. In this configuration, the in-plane thermal conductivity of the thermoelectric conversion device can be reduced. The reduction in the in-plane thermal conductivity allows the thermoelectric conversion efficiency of the thermoelectric conversion device to be further reduced. Moreover, when, for example, the thermoelectric conversion device is disposed inside the substrate 122, diffusion of heat from the thermoelectric conversion device in in-plane directions of the substrate 122 can be reduced. The reduction in the diffusion of heat can increase, for example, flexibility in the formation of an electronic device on the substrate 122.

The fifth phononic crystal structure and the sixth phononic crystal structure can be structurally the same as the phononic crystal structure described above for the first phononic crystal structure.

The thermoelectric conversion element of the present disclosure can be used, for example, as a Peltier element or a Seebeck element for various applications.

What is claimed is:
1. A thermoelectric conversion element, comprising:
a p-type thermoelectric converter;
an n-type thermoelectric converter;
a first electrode;
a second electrode; and
a third electrode,
wherein a first end of the p-type thermoelectric converter is electrically connected to a first end of the n-type thermoelectric converter through the first electrode,
wherein a second end of the p-type thermoelectric converter is electrically connected to the second electrode,
wherein a second end of the n-type thermoelectric converter is electrically connected to the third electrode,
wherein the p-type thermoelectric converter includes a first phononic crystal layer having a first phononic crystal structure including a plurality of regularly arranged first through holes,
wherein the n-type thermoelectric converter includes a second phononic crystal layer having a second phononic crystal structure including a plurality of regularly arranged second through holes,
wherein a through direction of the plurality of first through holes in the first phononic crystal structure is a direction extending between the first end of the p-type thermoelectric converter and the second end thereof,
wherein a through direction of the plurality of second through holes in the second phononic crystal structure is a direction extending between the first end of the n-type thermoelectric converter and the second end thereof, wherein the p-type thermoelectric converter further includes a third phononic crystal layer having a third phononic crystal structure including a plurality of regularly arranged third through holes, wherein the n-type thermoelectric converter further includes a fourth phononic crystal layer having a fourth phononic crystal structure including a plurality of regularly arranged fourth through holes, wherein the first phononic crystal layer and the third phononic crystal layer are stacked in the direction extending between the first end of the p-type thermoelectric converter and the second end thereof, wherein the second phononic crystal layer and the fourth phononic crystal layer are stacked in the direction extending between the first end of the n-type thermoelectric converter and the second end thereof, wherein the through direction of the plurality of first through holes in the first phononic crystal structure is substantially parallel to a through direction of the plurality of third through holes in the third phononic crystal structure, wherein the through direction of the plurality of second through holes in the second phononic crystal structure is substantially parallel to a through direction of the plurality of fourth through holes in the fourth phononic crystal structure, and wherein at least one requirement selected from the group consisting of the following requirements (I) to (III) is satisfied:
(I) a period of an arrangement of the first through holes differs from a period of an arrangement of the third through holes,
(II) a diameter of the first through holes differs from a diameter of the third through holes, and
(III) a type of a unit cell including the first through holes differs from a type of a unit cell including the third through holes.

2. The thermoelectric conversion element according to claim 1, wherein the first phononic crystal layer is in contact with the third phononic crystal layer, and
wherein the second phononic crystal layer is in contact with the fourth phononic crystal layer.

3. The thermoelectric conversion element according to claim 1, wherein at least part of the third through holes are not in communication with the first through holes, and
wherein at least part of the fourth through holes are not in communication with the second through holes.

4. The thermoelectric conversion element according to claim 1, wherein the first phononic crystal structure includes a first domain and a second domain that are phononic crystal regions,
wherein the first domain includes some of the plurality of first through holes that are regularly arranged in a first direction in a cross section perpendicular to the through direction of the first through holes,
wherein the second domain includes some of the plurality of first through holes that are regularly arranged in a second direction different from the first direction in the cross section perpendicular to the through direction of the first through holes,
wherein the second phononic crystal structure includes a third domain and a fourth domain that are phononic crystal regions,
wherein the third domain includes some of the plurality of second through holes that are regularly arranged in a third direction in a cross section perpendicular to the through direction of the second through holes, and
wherein the fourth domain includes some of the plurality of second through holes that are regularly arranged in a fourth direction different from the third direction in the cross section perpendicular to the through direction of the second through holes.

5. The thermoelectric conversion element according to claim 1, wherein the first phononic crystal structure includes a first domain and a second domain that are phononic crystal regions,
wherein the first domain includes some of the plurality of first through holes that are regularly arranged in a first direction in a cross section perpendicular to the through direction of the first through holes,
wherein the second domain includes some of the plurality of first through holes that are regularly arranged in a second direction different from the first direction in the cross section perpendicular to the through direction of the first through holes,
wherein the second phononic crystal structure includes a third domain and a fourth domain that are phononic crystal regions,
wherein the third domain includes some of the plurality of second through holes that are regularly arranged in a third direction in a cross section perpendicular to the through direction of the second through holes,
wherein the fourth domain includes some of the plurality of second through holes that are regularly arranged in a fourth direction different from the third direction in the cross section perpendicular to the through direction of the second through holes,
wherein the third phononic crystal structure includes a fifth domain and a sixth domain that are phononic crystal regions,
wherein the fifth domain includes some of the plurality of third through holes that are regularly arranged in a fifth direction in a cross section perpendicular to the through direction of the third through holes,
wherein the sixth domain includes some of the plurality of third through holes that are regularly arranged in a sixth direction different from the fifth direction in the cross section perpendicular to the through direction of the third through holes,
wherein the fourth phononic crystal structure includes a seventh domain and an eighth domain that are phononic crystal regions,
wherein the seventh domain includes some of the plurality of fourth through holes that are regularly arranged in a seventh direction in a cross section perpendicular to the through direction of the fourth through holes, and
wherein the eighth domain includes some of the plurality of fourth through holes that are regularly arranged in an eighth direction different from the seventh direction in the cross section perpendicular to the through direction of the fourth through holes.

6. The thermoelectric conversion element according to claim 1, wherein the first phononic crystal layer and/or the second phononic crystal layer includes a plurality of pillars,
wherein the pillars are columnar bodies extending linearly,
wherein each of the pillars has been filled into a corresponding one of the first through holes in the first phononic crystal layer and/or the second through holes in the second phononic crystal layer, and
wherein, when the pillars and the first phononic crystal layer and/or the second phononic crystal layer with the pillars filled thereinto are formed of the same material, a circumferential surface of each of the pillars is covered with an oxide film.

7. The thermoelectric conversion element according to claim 6, wherein each of the pillars has been filled into a corresponding one of the first through holes and the second through holes.

8. The thermoelectric conversion element according to claim 1, wherein a length of the first through holes is equal to or larger than two times a diameter of the first through holes, and
wherein a length of the second through holes is equal to or larger than two times a diameter of the second through holes.

9. The thermoelectric conversion element according to claim 1, wherein the first phononic crystal layer has a porosity equal to or more than 10%, and
wherein the second phononic crystal layer has a porosity equal to or more than 10%.

10. A thermoelectric conversion device comprising:
a substrate;
a first insulating layer disposed on the substrate;
a thermoelectric conversion module disposed on the first insulating layer;
a second insulating layer disposed on the thermoelectric conversion module;
a first wiring line; and
a second wiring line,
wherein the thermoelectric conversion module includes a thermoelectric conversion element assembly including two or more thermoelectric conversion elements and a pair of connection electrodes connected to the thermoelectric conversion element assembly,
wherein the two or more thermoelectric conversion elements are electrically connected in series between the pair of connection electrodes,
wherein the first wiring line is electrically connected to a first one of the connection electrodes,
wherein the second wiring line is electrically connected to a second one of the connection electrodes, and
wherein each of the two or more thermoelectric conversion elements is the thermoelectric conversion element according to claim 1.

11. The thermoelectric conversion device according to claim 10, wherein, in the thermoelectric conversion module, the two or more thermoelectric conversion elements are arranged in a two-dimensional array.

12. The thermoelectric conversion device according to claim 10, wherein, in the thermoelectric conversion module, the two or more thermoelectric conversion elements are arranged in a three dimension array.

13. The thermoelectric conversion device according to claim 10, wherein the thermoelectric conversion module further includes an insulating portion disposed between the thermoelectric converters included in each thermoelectric conversion element and/or an insulating portion disposed between each adjacent two of the two or more thermoelectric conversion elements, and
wherein each insulating portion has a phononic crystal structure including a plurality of regularly arranged through holes.

14. The thermoelectric conversion device according to claim 10, wherein at least one member selected from the substrate, the first insulating layer, and the second insulating layer has a phononic crystal structure including a plurality of regularly arranged through holes.

* * * * *